(12) United States Patent
Zhu et al.

(10) Patent No.: US 12,144,236 B2
(45) Date of Patent: Nov. 12, 2024

(54) DISPLAY SUBSTRATE HAVING PHOTOSENSITIVE SENSING UNIT LOCATED IN VISIBLE LIGHT SIGNAL RECEIVING REGION

(71) Applicant: BOE Technology Group Co., Ltd., Beijing (CN)

(72) Inventors: Haibin Zhu, Beijing (CN); Qingyu Huang, Beijing (CN); Weijie Wang, Beijing (CN); Lu Wang, Beijing (CN); Guangcai Yuan, Beijing (CN); Fengjie Zhang, Beijing (CN); Dongliang Bai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 493 days.

(21) Appl. No.: 17/434,409

(22) PCT Filed: Feb. 19, 2021

(86) PCT No.: PCT/CN2021/076871
§ 371 (c)(1),
(2) Date: Aug. 26, 2021

(87) PCT Pub. No.: WO2021/175120
PCT Pub. Date: Sep. 10, 2021

(65) Prior Publication Data
US 2022/0344405 A1 Oct. 27, 2022

(30) Foreign Application Priority Data
Mar. 5, 2020 (CN) .......................... 202010148757.0

(51) Int. Cl.
*H10K 65/00* (2023.01)
*H04B 10/116* (2013.01)
(Continued)

(52) U.S. Cl.
CPC ........... *H10K 65/00* (2023.02); *H04B 10/116* (2013.01); *H10K 30/80* (2023.02); *H10K 39/30* (2023.02)

(58) Field of Classification Search
CPC ........ H10K 65/00; H10K 30/80; H10K 39/30; H04B 10/116
(Continued)

(56) References Cited

U.S. PATENT DOCUMENTS

2009/0086353 A1 4/2009 Tsai et al.
2018/0373074 A1* 12/2018 Li ....................... G02F 1/13394
(Continued)

FOREIGN PATENT DOCUMENTS

CN 106059667 A 10/2016
CN 106330313 A 1/2017
(Continued)

OTHER PUBLICATIONS

International Search Report for PCT/CN2021/076871 Mailed May 25, 2021.

*Primary Examiner* — Phuc T Dang
(74) *Attorney, Agent, or Firm* — Ling Wu; Stephen Yang; Ling and Yang Intellectual Property

(57) ABSTRACT

Provided are a display substrate and a manufacturing method thereof, and a visible light communication apparatus. The display substrate includes a substrate, and the substrate includes a display region and a peripheral region surrounding the display region; the peripheral region includes a visible light signal receiving region surrounding the display region; the display substrate further includes a photosensitive sensing unit, the photosensitive sensing unit is located in the visible light signal receiving region and is
(Continued)

configured to receive a visible light signal and convert the visible light signal into an electrical signal to achieve visible light communication.

16 Claims, 14 Drawing Sheets

(51) Int. Cl.
  *H10K 30/80* (2023.01)
  *H10K 39/30* (2023.01)
(58) Field of Classification Search
  USPC .......................................................... 257/81
  See application file for complete search history.

(56) References Cited

U.S. PATENT DOCUMENTS

2019/0007136 A1     1/2019  Ye et al.
2020/0028589 A1 *   1/2020  Li ....................... H01L 27/1214

FOREIGN PATENT DOCUMENTS

| CN | 108363993 | A |   | 8/2018 |   |   |
|----|-----------|---|---|--------|---|---|
| CN | 108964762 | A |   | 12/2018 |   |   |
| CN | 110827781 | A |   | 2/2020 |   |   |
| CN | 111341808 | A |   | 6/2020 |   |   |
| KR | 20160135879 | A | * | 11/2016 | ........... | G02F 1/0107 |

* cited by examiner

| Form a drive circuit layer and a photosensitive sensing unit located in a visible light signal receiving region on a substrate, wherein the drive circuit layer includes a first drive circuit and a second drive circuit, the first drive circuit is configured to drive the photosensitive sensing unit, the second drive circuit is configured to drive a subpixel of a display region, and the photosensitive sensing unit is configured to receive a visible light signal and convert the visible light signal into an electrical signal to achieve visible light communication | ~100 |

↓

| Form the subpixel of the display region on the drive circuit layer, wherein the visible light signal receiving region is disposed in a peripheral annular region surrounding the display region | ~200 |

FIG. 29

DISPLAY SUBSTRATE HAVING PHOTOSENSITIVE SENSING UNIT LOCATED IN VISIBLE LIGHT SIGNAL RECEIVING REGION

The present application claims priority to Chinese patent application No. 2020101487570 filed to CNIPA on Mar. 5, 2020, titled "A Display Substrate and Manufacturing Method Thereof, and Visible Light Communication Apparatus", the content of which should be regarded as being incorporated herein by reference in its entirety.

TECHNICAL FIELD

The embodiments of the present disclosure relate to, but are not limited to, the field of display technologies, in particular to a display substrate and a manufacturing method thereof, and a visible light communication apparatus.

BACKGROUND

In the Visible Light Communication (VLC) technology, a light emitting diode used in actual lighting is used to emit a fast-flickering signal with brightness changes invisible to human eyes to transmit information. At a receiving end, a sensing unit sensitive to visible light within a corresponding spectral range is used to receive the flickering signal with brightness changes and convert the flickering signal into an electrical signal, and the electrical signal is demodulated by a subsequent circuit to obtain desired communication data.

SUMMARY

The following is a brief description of the subject matter detailed herein. This brief description is not intended to limit the scope of protection of the claims.

An embodiment of the present disclosure provides a display substrate, including: a substrate including a display region and a peripheral region surrounding the display region, wherein the peripheral region includes a visible light signal receiving region surrounding the display region; and a photosensitive sensing unit located in the visible light signal receiving region, wherein the photosensitive sensing unit is configured to receive a visible light signal and convert the visible light signal into an electrical signal to achieve visible light communication.

In some exemplary embodiments, the display substrate further includes a plurality of subpixels located in the display region, wherein at least one of the plurality of subpixels includes an anode, a cathode, and a light emitting layer located between the anode and the cathode, and the cathode is located on the side of the substrate away from the light emitting layer; and the peripheral region includes a cathode overlap region, the cathode extends to the cathode overlap region, and the photosensitive sensing unit is located between the cathode overlap region and the display region and between the cathode and the substrate.

In some exemplary embodiments, the visible light signal receiving region is further provided with a first conductive layer, a second conductive layer, and an insulating isolation layer, the first conductive layer is disposed on the surface of the photosensitive sensing unit facing the substrate, the second conductive layer is disposed on the surface of the photosensitive sensing unit away from the substrate, and the insulating isolation layer is disposed on the surface of the second conductive layer away from the photosensitive sensing unit.

In some exemplary embodiments, the display substrate further includes a plurality of subpixels located in the display region, wherein at least one of the plurality of subpixels includes an anode, a cathode, and a light emitting layer located between the anode and the cathode, and the cathode is located on the side of the substrate away from the light emitting layer; and the peripheral region includes a cathode overlap region, the cathode extends to the cathode overlap region, and the photosensitive sensing unit is located on the side of the cathode overlap region away from the display region.

In some exemplary embodiments, the visible light signal receiving region is further provided with a first conductive layer and a second conductive layer, the first conductive layer is disposed on the surface of the photosensitive sensing unit facing the substrate, and the second conductive layer is disposed on the surface of the photosensitive sensing unit away from the substrate.

In some exemplary embodiments, the display substrate further includes a plurality of subpixels located in the display region, wherein the photosensitive sensing unit is further located between the subpixels and is isolated from the subpixels by a light shielding wall.

In some exemplary embodiments, the visible light signal receiving region is further provided with a plurality of drive switches, and the drive switch is configured to control switch-on and switch-off of the photosensitive sensing unit under the control of a drive circuit.

In some exemplary embodiments, a light shielding wall is disposed between the visible light signal receiving region and the display region.

In some exemplary embodiments, a blue light filter layer and a polarizer layer are further disposed on the substrate, and the blue light filter layer is disposed on the surface of the polarizer layer facing or away from the photosensitive sensing unit and is opposite to the visible light signal receiving region in position.

In some exemplary embodiments, the visible light signal receiving region includes a first color receiving region, a second color receiving region and a third color receiving region, a first isolation region is disposed between the first color receiving region and the second color receiving region, and a second isolation region is disposed between the second color receiving region and the third color receiving region.

In some exemplary embodiments, a complex filter layer and a polarizer layer are further disposed on the substrate, the complex filter layer is disposed on the surface of the polarizer layer facing or away from the photosensitive sensing unit, the complex filter layer includes a first color filter layer, a second color filter layer, and a third color filter layer, a third isolation region is disposed between the first color filter layer and the second color filter layer, a fourth isolation region is disposed between the second color filter layer and the third color filter layer, the first color filter layer is opposite to the first color receiving region in position, the second color filter layer is opposite to the second color receiving region in position, and the third color filter layer is opposite to the third color receiving region in position.

In some exemplary embodiments, a lens layer is further disposed on the substrate, the lens layer is provided with a condenser lens opposite to the visible light signal receiving region in position, and a cross-sectional shape of the condenser lens includes any one or more of the following cases: the cross-sectional shape of the condenser lens is a bow shape; the cross-sectional shape of the condenser lens is a semicircular shape; and the cross-sectional shape of the condenser lens includes a first toothed portion, a curved surface portion, and a second toothed portion, the first toothed portion and the second toothed portion are symmetrical about the center of the curved surface portion, and the curved surface portion is a convex curved surface.

In some exemplary embodiments, the structure of the first toothed portion and the second toothed portion is either of the following cases: the first toothed portion and the second toothed portion each include a plurality of concentric annular teeth, and each concentric annular tooth is inclined at a preset angle towards the direction to the circle center; or the first toothed portion and the second toothed portion each include a plurality of stepped teeth, and each stepped tooth is inclined at a preset angle towards the direction to the curved surface center; and the structure of the curved surface portion is a convex annular curved surface or a convex stepped curved surface.

In some exemplary embodiments, a filter layer and a polarizer layer are further disposed on the substrate, and the filter layer is disposed in the same layer as the lens layer or disposed on the surface of the lens layer facing the substrate; and the lens layer and the filter layer are disposed on the surface of the polarizer layer facing or away from the photosensitive sensing unit, and are opposite to the visible light signal receiving region in position.

An embodiment of the present disclosure further provides a visible light communication apparatus, including the display substrate described above.

In some exemplary embodiments, the visible light communication apparatus further includes cover glass, wherein the outer surface of the edge of the cover glass is an arc surface, and the inner surface of the edge of the cover glass is a planar surface, so that the edge of the cover glass forms a spherical lens.

An embodiment of the present disclosure further provides a method for manufacturing a display substrate, including: forming a drive circuit layer and a photosensitive sensing unit located in a visible light signal receiving region on a substrate, wherein the drive circuit layer includes a first drive circuit and a second drive circuit, the first drive circuit is configured to drive the photosensitive sensing unit, the second drive circuit is configured to drive a subpixel of a display region, and the photosensitive sensing unit is configured to receive a visible light signal and convert the visible light signal into an electrical signal to achieve visible light communication; and forming the subpixel of the display region on the drive circuit layer, wherein the visible light signal receiving region is disposed in a peripheral annular region surrounding the display region.

After reading and understanding of the brief description of the drawings and the embodiments of the present disclosure, other aspects can be understood.

BRIEF DESCRIPTION OF DRAWINGS

The drawings are provided to understand the technical solutions of the embodiments of the present disclosure, constitute a part of the description, and are used to explain the technical solutions of the present disclosure together with the embodiments of the present disclosure, without limiting the technical solutions of the present disclosure.

FIG. 29 is a flowchart of a method for manufacturing a display substrate according to an embodiment of the present disclosure.

DETAILED DESCRIPTION

In order to make the purposes, technical solutions, and advantages of the present disclosure more clear, the embodiments of the present disclosure are described in detail below with reference to the drawings. It should be noted that the embodiments in the present disclosure and the features in the embodiments may be randomly combined with each other without conflict.

Unless otherwise defined, the technical terms or scientific terms disclosed in the embodiments of the present disclosure shall have a general meaning understood by those skilled in the art. Phrases such as "first" and "second" used in the embodiments of the present disclosure do not indicate any order, quantity, or importance, but are only used to distinguish different components. Phrases such as "including" or "comprising" indicate that the element or object in front of the phrase covers the element or object listed after the word and equivalents thereof but does not exclude other elements or objects.

Figure 1:
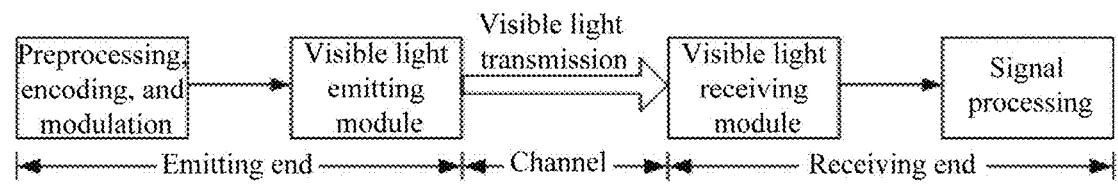
FIG. 1 is a schematic diagram of a structure of a visible light communication system according to an embodiment of the present disclosure.

Referring to FIG. 1, a VLC system mainly includes a complete emitting end, a channel, and a receiving end, and the receiving technology is an extremely important link in visible light communication, mainly involving the selection, decoding, demodulation, and post-equalization of a photosensitive sensing unit. Since in visible light communication, the brightness of light is modulated at a high frequency invisible to human eyes, the integration of lighting and communication can be realized. Although there are display products with a visible light communication function in some technologies, such the display product is not a real communication and display integrated device, but mechanically integrates an independent visible light receiving module into a display device to realize the visible light communication function.

An embodiment of the present disclosure provides a display substrate. The display substrate includes a substrate and a photosensitive sensing unit. The substrate includes a display region and a peripheral region surrounding the display region. The peripheral region includes a visible light signal receiving region surrounding the display region. The photosensitive sensing unit is located in the visible light signal receiving region, and the photosensitive sensing unit is configured to receive a visible light signal and convert the visible light signal into an electrical signal to achieve visible light communication. The display substrate provided by the embodiment of the present disclosure can realize the real function of integration of visible light communication and display, and has a characteristic of high-speed data transmission.

The display substrate of the embodiment of the present disclosure can be implemented by various solutions. The technical solutions of the embodiments of the present disclosure are described below in detail via a plurality of embodiments.

Figure 2:
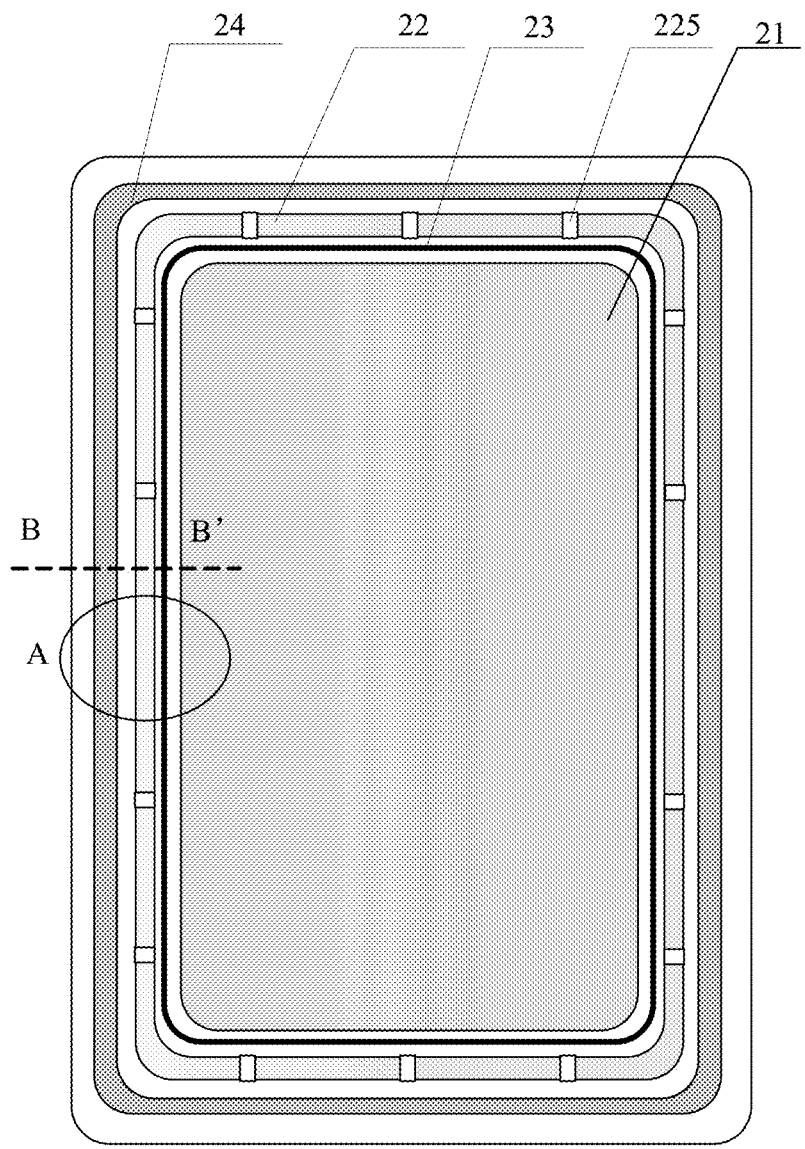
FIG. 2 is a first schematic diagram of a top-view structure of a display substrate according to an embodiment of the present disclosure.
Figure 3:
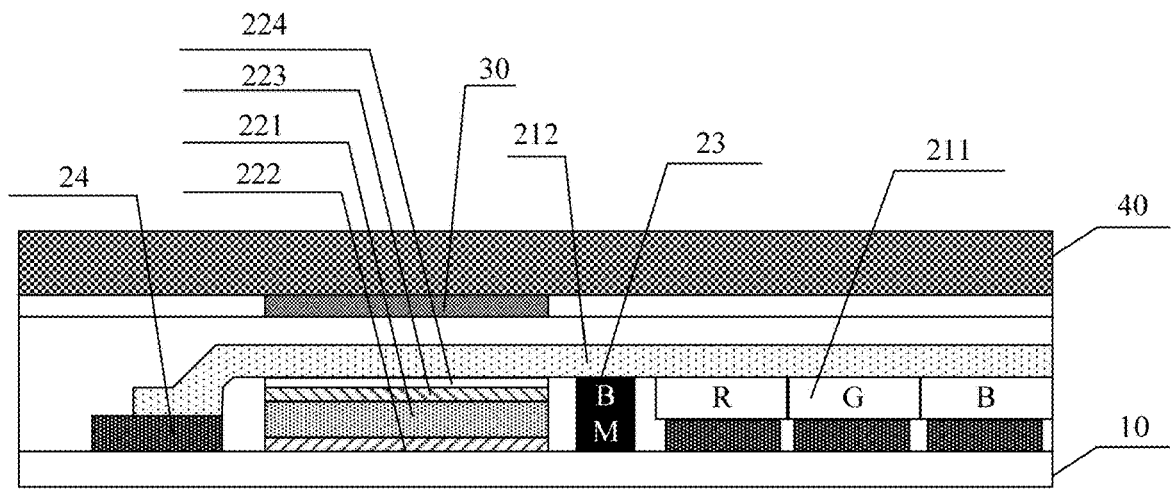
FIG. 3 is a first schematic diagram of a sectional structure of a portion BB' of the display substrate in FIG. 2.
Figure 4:
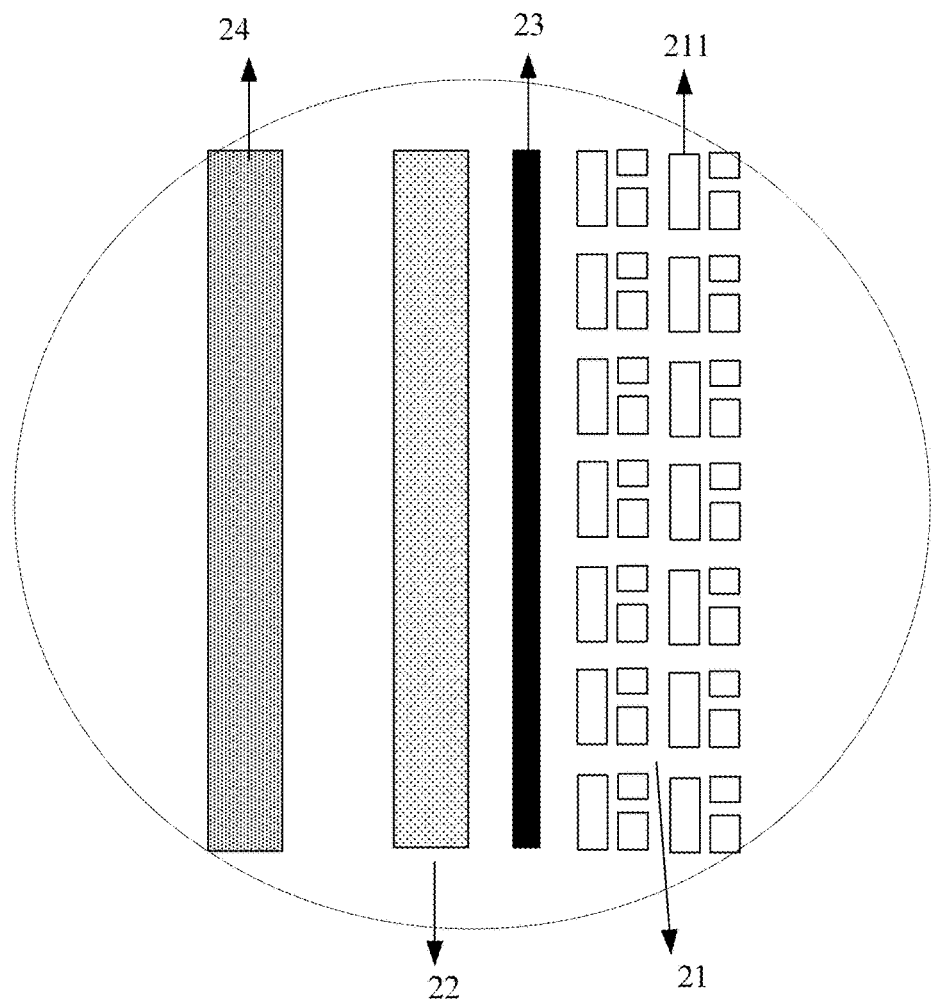
FIG. 4 is a schematic diagram of a partially enlarged structure of a portion A of the display substrate in FIG. 2.

FIG. 2 and FIG. 3 are first schematic diagrams of a structure of a display substrate provided by an embodiment of the present disclosure. FIG. 4 is a schematic diagram of a partially enlarged structure of a portion A in FIG. 2. Referring to FIG. 2, FIG. 3, and FIG. 4, the display substrate provided by this embodiment includes a substrate 10, wherein the substrate 10 includes a display region 21 and a peripheral region surrounding the display region 21, the display region 21 includes a plurality of subpixels 211, and the peripheral region includes a visible light signal receiving region 22 surrounding the display region 21. The visible light signal receiving region 22 is provided with a photosensitive sensing unit 221, and the photosensitive sensing unit 221 is configured to receive a visible light signal and convert the visible light signal into an electrical signal to achieve visible light communication.

In this embodiment, the visible light signal receiving region 22 may be one or more annular regions surrounding the display region 21.

At present, the display substrate usually requires a relatively high pixel density, i.e., Pixel Per Inch (PPI). It is inappropriate to dispose the visible light signal receiving region 22 in the display region 21; otherwise, the display resolution may be reduced to a certain extent. In addition, it is also inappropriate to dispose the visible light signal receiving region 22 in a centralized region on the outer side of the display region 21, for example, near the home key at the lower end of a mobile phone screen or near the camera at the upper end. On the one hand, products such as a mobile phone or TV pursue narrow frames, so it is infeasible to reserve a centralized region for receiving the visible light signal receiving region 22. On the other hand, such a design has a relatively large risk, that is, once the centralized region is blocked during operation, the case in which the visible light signal is interrupted is easy to occur. In addition, in order to achieve a better visible light communication effect and an inductive receiving area as large as possible to receive more visible light, the embodiment of the present disclosure designs the visible light signal receiving region into one or more annular regions (as illustrated in FIG. 3) extending along the periphery of the display region 21, thereby ensuring a large total inductive receiving area as well as increasing the total length of the receiving region. Therefore, the case of large-area blocking does not occur. For example, during single-hand operation or double-hand operation on the mobile phone, only an extremely small region is blocked, while most of the receiving region is exposed; in a peripheral region of a TV screen, due to the larger length, there is less possibility for the case of large-area blocking to occur, thereby ensuring a good visible light signal reception effect.

In this embodiment, referring to FIG. 2, FIG. 3 and FIG. 4, a light shielding wall 23 is disposed between the visible light signal receiving region 22 and the display region 21. In this embodiment, a circle of black light shielding wall 23 is designed between the visible light signal receiving region 22 and the display region 21 (optionally, on the inner side of the visible light signal receiving region 22 close to the display region 21), so as avoid stray light interference to the visible light signal receiving region 22 generated when the subpixels 211 in the display region 21 emit light.

In some embodiments of the present disclosure, the material of the light shielding wall 23 may be a photoresist resin material for making a black matrix. The height of the light shielding wall 23 may be equal to the height of a Pixel Definition Layer (PDL), or slightly greater than the device height of the photosensitive sensing unit 221.

In some embodiments of the present disclosure, referring to FIG. 2, FIG. 3, and FIG. 4, at least one of the plurality of subpixels 211 includes an anode, a cathode 212, and a light emitting layer located between the anode and the cathode, the cathode 212 is located on the side of the substrate 10 away from the light emitting layer, the peripheral region includes a cathode overlap region 24, and the cathode 212 extends to the cathode overlap region 24.

In some embodiments of the present disclosure, referring to FIG. 3, the photosensitive sensing unit 221 is located between the cathode overlap region 24 and the display region 21 and between the cathode 212 and the substrate 10.

In this embodiment, the visible light signal receiving region 22 is further provided with a first conductive layer 222, a second conductive layer 223, and an insulating isolation layer 224. The first conductive layer 222 is disposed on the surface of the photosensitive sensing unit 221 facing the substrate 10. The second conductive layer 223 is disposed on the surface of the photosensitive sensing unit 221 away from the substrate 10. The insulating isolation layer 224 is disposed on the surface of the second conductive layer 223 away from the photosensitive sensing unit 221. The visible light signal receiving region 22 in this embodiment is disposed between the cathode overlap region 24 and the display region 21, so that the photosensitive sensing unit 221 is under the cathode 212 of the display region. By respectively designing the second conductive layer 223 and the first conductive layer 222 on the upper and lower sides of the photosensitive sensing unit 221 and disposing the insulating isolation layer 224 between the second conductive layer 223 and the cathode 212, the conductivity of the photosensitive sensing unit 221 is improved and a voltage drop caused by the excessively large length of the entire device is reduced.

Figure 5:
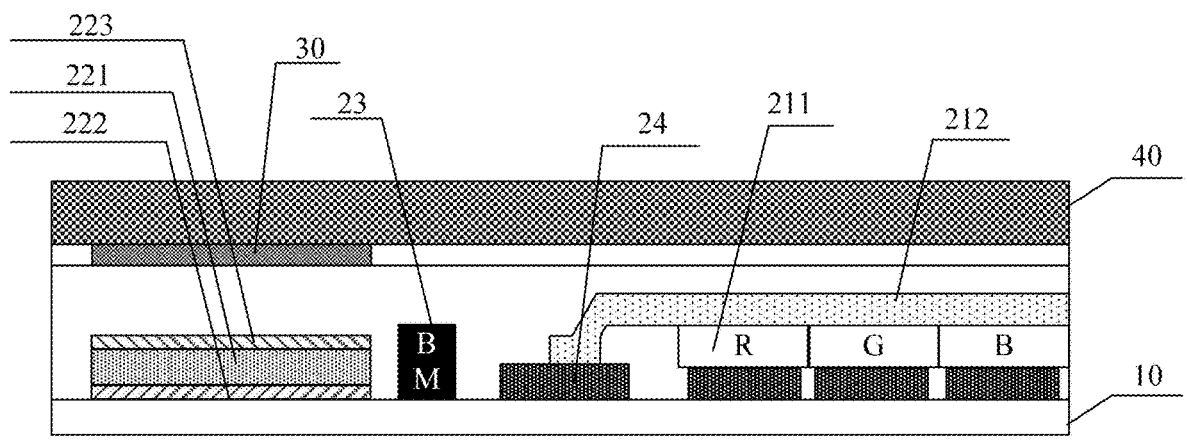
FIG. 5 is a second schematic diagram of a sectional structure of a display substrate according to an embodiment of the present disclosure.

In other embodiments of the present disclosure, referring to FIG. 5, the photosensitive sensing unit is located on the side of the cathode overlap region 24 away from the display region.

In this embodiment, the visible light signal receiving region 22 is further provided with a first conductive layer 222 and a second conductive layer 223. The first conductive layer 222 is disposed on the surface of the photosensitive sensing unit 221 facing the substrate 10. The second conductive layer 223 is disposed on the surface of the photosensitive sensing unit 221 away from the substrate 10. The visible light signal receiving region 22 in this embodiment is disposed between the cathode overlap region 24 and the edge of the display substrate, so that the photosensitive sensing unit 221 is located on the outer side of the cathode 212 of the display region and is not covered by the cathode 212, with a packaging layer above the photosensitive sensing unit 221. Therefore, there is no need to dispose an insulating isolation layer 224 on the second conductive layer 223. By respectively designing the second conductive layer 223 and the first conductive layer 222 on the upper and lower sides of the photosensitive sensing unit 221, the conductivity of the photosensitive sensing unit 221 is improved and a voltage drop caused by the excessively large length of the entire device is reduced.

Figure 6:
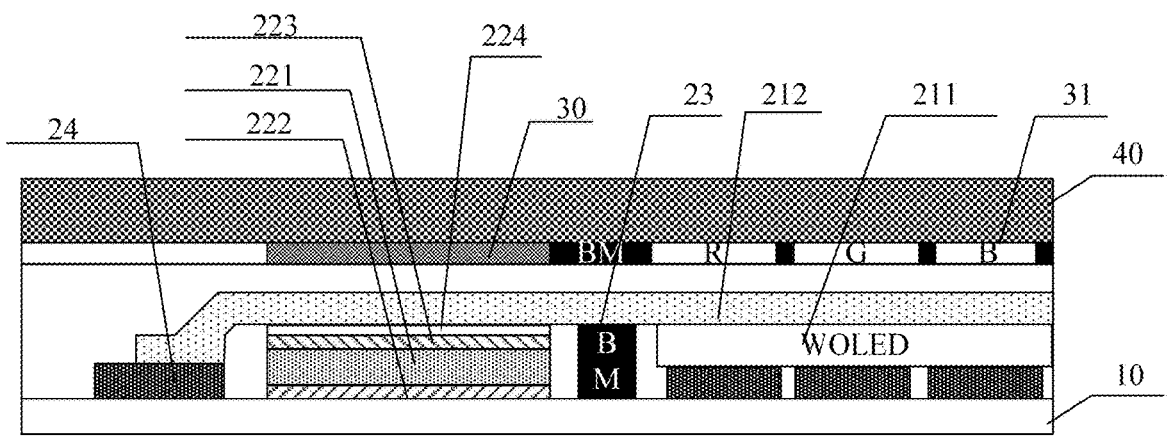
FIG. 6 is a third schematic diagram of a sectional structure of a display substrate according to an embodiment of the present disclosure.

In some embodiments of the present disclosure, referring to FIG. 3, FIG. 5, and FIG. 6, the display substrate further includes a blue light filter layer 30 and a polarizer layer 40. The blue light filter layer 30 is disposed on the surface of the polarizer layer 40 facing or away from the photosensitive sensing unit 221, and the blue light filter layer 30 is opposite to the light sensitive sensing unit 221 in position. The polarizer layer 40 can filter out stray light in the sunlight to reduce the interference to the visible light communication. The blue light filter layer 30 can filter out the interference of yellow light in a fluorescent LED emitting end to improve the modulation bandwidth of the visible light communication.

In this embodiment, considering that the polarizer layer 40 can filter out the stray light in the sunlight, a better effect may be achieved by disposing the blue light filter layer 30 on the surface of the polarizer layer 40 facing the photosensitive sensing unit 221.

When the visible light emitting end is a fluorescent LED, since the fluorescent LED mainly operates by exciting phosphorus phosphor to generate yellow light using a blue LED, blue light and the yellow light mix to obtain white light. However, a slow response speed of the phosphorus phosphor limits the modulation bandwidth of the LED. Therefore, in the embodiment of the present disclosure, the blue light filter layer 30 is designed in a local region above the packaging layer to filter out the yellow light, so as to improve the modulation bandwidth, while the remaining region is a transparent layer that does not affect the display effect of the display region 21.

A blue light filter region in the blue light filter layer 30 is disposed above the photosensitive sensing unit 221, while the remaining region is a transparent layer. The material of the blue light filter region may be a conventional organic blue light filter material, a quantum dot material, or the like.

In other embodiments of the present disclosure, referring to FIG. 7, FIG. 8, FIG. 9, and FIG. 10, the visible light signal receiving region 22 includes a first color receiving region 25, a second color receiving region 27, and a third color receiving region 29. A first isolation region 26 is disposed between the first color receiving region 25 and the second color receiving region 27. A second isolation region 28 is disposed between the second color receiving region 27 and the third color receiving region 29.

In this embodiment, the first color receiving region 25, the second color receiving region 27, and the third color receiving region 29 each may be one of a red light receiving region, a green light receiving region, and a blue light receiving region.

In this embodiment, the display substrate further includes a complex filter layer 32 and a polarizer layer 40. The complex filter layer 32 is disposed on the surface of the polarizer layer 40 facing or away from the photosensitive sensing unit 221. The complex filter layer 32 includes a first color filter layer 33, a second color filter layer 35, and a third color filter layer 37. A third isolation region 34 is disposed between the first color filter layer 33 and the second color filter layer 35. A fourth isolation region 36 is disposed between the second color filter layer 35 and the third color filter layer 37. The first color filter layer 33 is opposite to the first color receiving region 25 in position, the second color filter layer 35 is opposite to the second color receiving region 27 in position, and the third color filter layer 37 is opposite to the third color receiving region 29 in position.

In this embodiment, the first color filter layer 33, the second color filter layer 35, and the third color filter layer 37 each may be one of a red light filter layer, a green light filter layer, and a blue light filter layer.

When the visible light emitting end is an RGB LED, the RGB LED is mainly used for mixing to obtain white light. This type of LED light emitting end has a wide modulation bandwidth and a higher communication transmission rate. In order to reduce intersymbol crosstalk between signals emitted by different color LEDs, in the embodiment of the present disclosure, the first color filter layer 33, the second color filter layer 35, and the third color filter layer 37 distributed in an annular shape are separately designed above the packaging layer of the display region 21 (the first color filter layer 33, the second color filter layer 35, and the third color filter layer 37 are disposed on the same layer 31 as the color filter layer of the display region) to separate the three color light signals from each; the visible light signal receiving region 22 is designed as three annular regions distributed on the periphery of a display screen, which are in one-to-one correspondence with the above three color filter layers and are configured to receive the three color light signals respectively. The three annular regions are separated from each other by a black organic insulating material, thus reducing the crosstalk between light signals of different colors, as well as effectively avoiding crosstalk between electrical signals generated from the light signals. This design solution can not only ensure a high transmission rate, but also effectively avoid the problem of signal crosstalk.

Since the three annular regions are configured to receive the three color light signals respectively, manufacturing processes of photosensitive sensing units corresponding to the three annular regions are different. The photosensitive sensing units corresponding to the three annular regions respectively have maximum response wavelengths with respect to the three color light signals, that is, the photosensitive sensing units respectively have maximum degrees of response to the three color light signals, so that the three annular regions can be configured to receive emission spectra of the three color light signals respectively, thus improving the photoelectric conversion efficiency.

In this embodiment, the visible light signal receiving region 22 may be disposed in an intermittent distribution or continuous distribution, and the filter layer (including blue light filter layer 30 or complex filter layer 32) above the visible light signal receiving region may also be disposed in an intermittent distribution or continuous distribution. In addition, the light shielding wall 23 may be disposed in an intermittent distribution or continuous distribution. In an exemplary embodiment, when the visible light signal receiving region 22 is disposed in an intermittent distribution, the filter layer above the visible light signal receiving region may be disposed in an intermittent distribution or continuous distribution, and the light shielding wall 23 may be disposed in an intermittent distribution or continuous distribution; when the visible light signal receiving region 22 is disposed in a continuous distribution, the filter layer above the visible light signal receiving region shall be disposed in a continuous distribution, and the light shielding wall 23 also shall be disposed in a continuous distribution.

Figure 7:
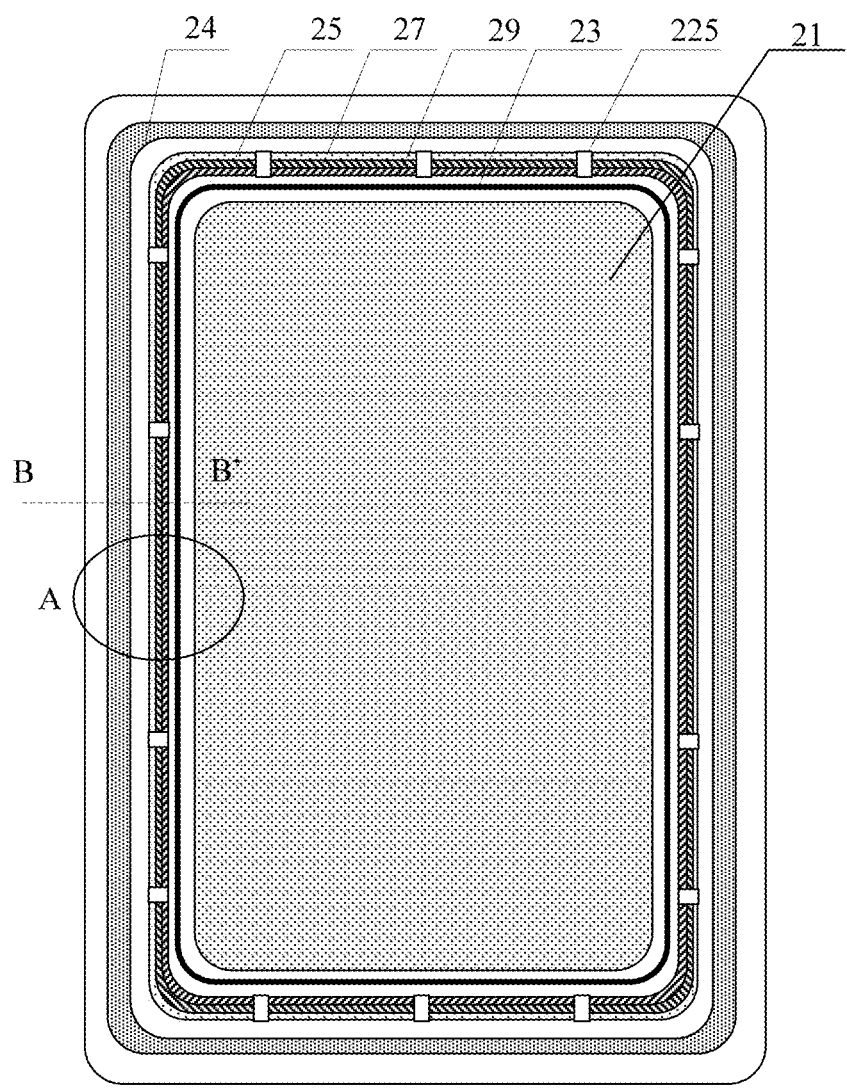
FIG. 7 is a second schematic diagram of a top-view structure of a display substrate according to an embodiment of the present disclosure.
Figure 8:
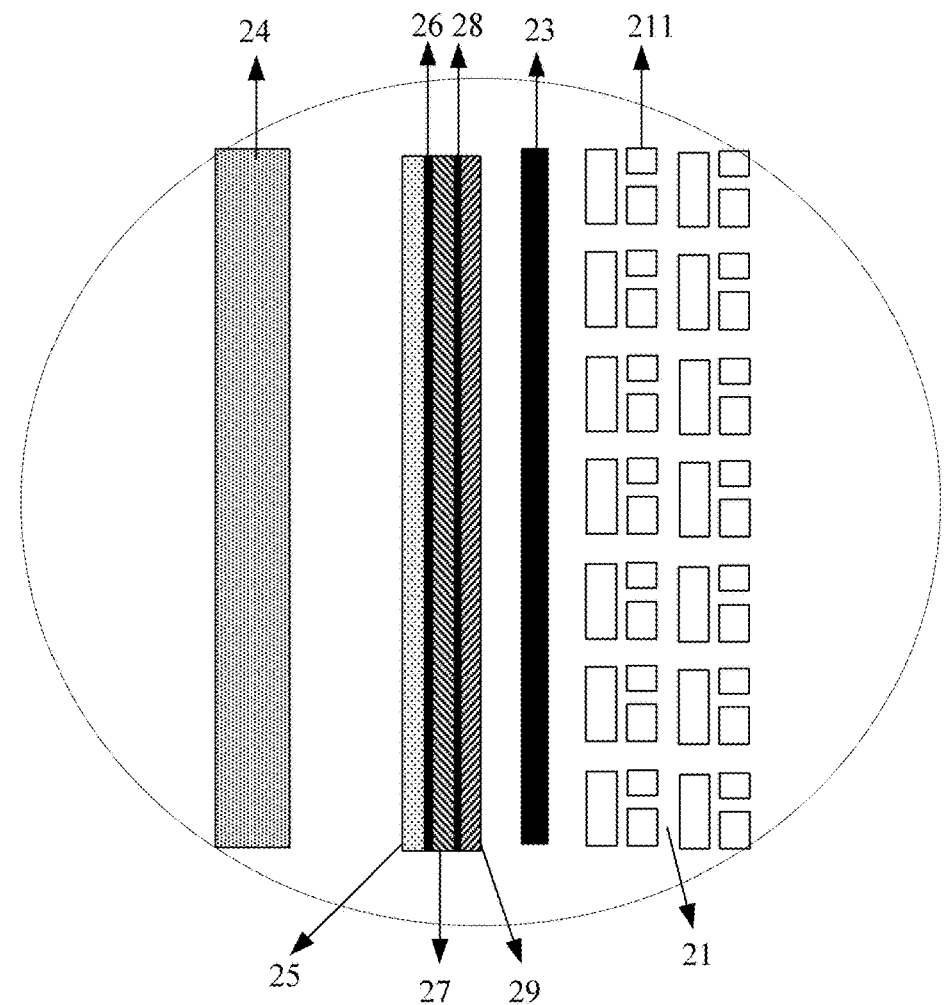
FIG. 8 is a schematic diagram of a partially enlarged structure of a portion A of the display substrate in FIG. 7.

In this embodiment, referring to FIG. 3 and FIG. 7, the visible light signal receiving region 22 is further provided with a plurality of drive switches 225, and the drive switches 225 are configured to control switch-on and switch-off of the photosensitive sensing unit 221 under the control of the first drive circuit.

In view of the problem that voltage drop and poor uniformity are apt to occur when the a bias voltage is applied after the total length of the visible light signal receiving region 22 is increased, in the embodiment of the present disclosure, conductive layers are respectively disposed on the upper and lower sides of the photosensitive sensing unit 221, and a plurality of drive switches 225 are respectively disposed at different positions on the visible light signal receiving region 22 (for example, the drive switches may be transistor switches). In this way, it can be ensured that bias voltages at different positions on the visible light signal receiving region 22 with such the length are approximately the same, thereby ensuring the uniformity and stability of a generated photocurrent.

In this embodiment, when the visible light signal receiving region 22 is configured to be photosensitive sensing units in an intermittent distribution, one drive switch 225 may be configured for each photosensitive sensing unit. In this way, although the difficulty in a manufacturing process of the drive circuit is increased, the difficulty in the manufacturing process of the photosensitive sensing unit is reduced, thus ensuring relatively high photoelectric conversion efficiency.

Figure 11:
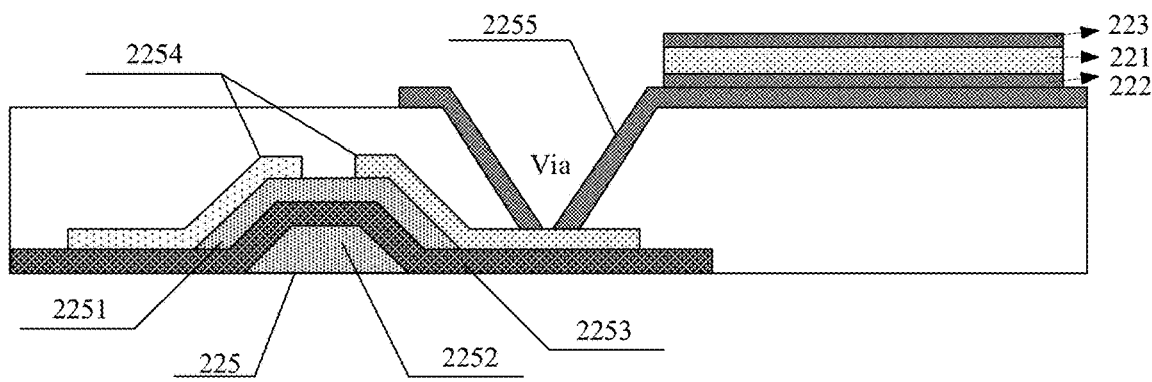
FIG. 11 is a schematic diagram of a connection structure of a drive switch and a photosensitive sensing unit according to an embodiment of the present disclosure.

The structures of the drive switch 225 and the photosensitive sensing unit 221 are as illustrated in FIG. 11. The drive switch 225 includes an active layer 2251, a gate 2252, an insulating layer 2253, a source-drain 2254, and a conductive layer 2255. The drain or source of the drive switch 225 is connected to the photosensitive sensing unit 221 by the conductive layer 2255. In this embodiment, the position of the drive switch 225 is not limited to the position illustrated in FIG. 11, and the number of the drive switches 225 may be increased according to the situations of voltage drop and current uniformity at different positions on the visible light signal receiving region 22.

In this embodiment, the photosensitive sensing unit 221 may be a photodiode, for example, a PIN photodiode or an Organic Photo Detector (OPD). In an exemplary embodiment, the structure of the organic photo detector is similar to that of an Organic Light Emitting Diode (OLED), including an anode layer, a hole transport layer, a light absorption layer, an electron transport layer, a cathode layer, etc. The device structure may be manufactured by a vacuum thermal evaporation method, a spin coating method, an inkjet printing method, etc.

In this embodiment, the second conductive layer 223 and the first conductive layer 222 may be made of metal elements such as magnesium (Mg), silver (Ag), and aluminum (Al) or metal alloys such as magnesium/silver (Mg/Ag), and main functions thereof are improving the conductivity of an upper electrode of the photodiode and reducing the voltage drop caused by the excessively large length of the entire device. Therefore, the metal component is not limited to the metals listed above. In addition, the metal layer is required to have good transmittance, and the thickness thereof ranges between 0.1 nm and 500 nm depending on the selected material.

The second conductive layer 223 and the first conductive layer 222 may also be made of metal oxides, such as indium tin oxide (ITO) and indium zinc oxide (IZO), and are required to have good conductivity and high transmittance to ensure efficient passage of the emitted light signal.

In this embodiment, when the photosensitive sensing unit 221 is an organic photo detector and an electrode on a light input side is made of a metal material having good conductivity, the second conductive layer 223 above the photosensitive sensing unit 221 may not be manufactured.

In this embodiment, the insulating isolation layer 224 may be made of an inorganic material, such as silicon nitride, silicon oxide, or silicon oxynitride, or may be made of an organic material, such as a resin material or polyimide, but it is not limited to the above materials. The material of this layer is required to be colorless and have good transmittance.

Figure 9:
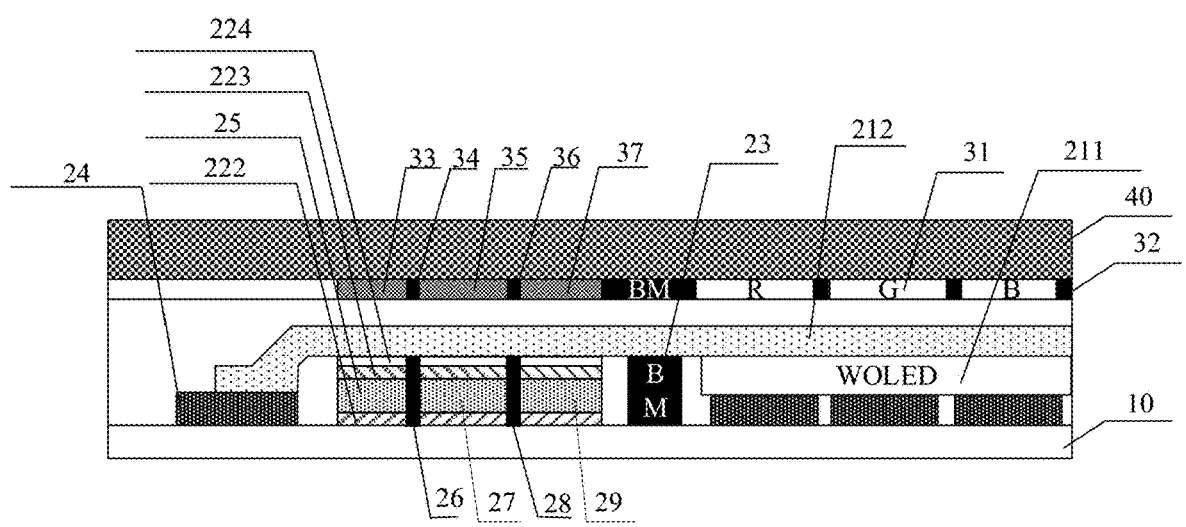
FIG. 9 is a fourth schematic diagram of a sectional structure of a display substrate according to an embodiment of the present disclosure.
Figure 10:
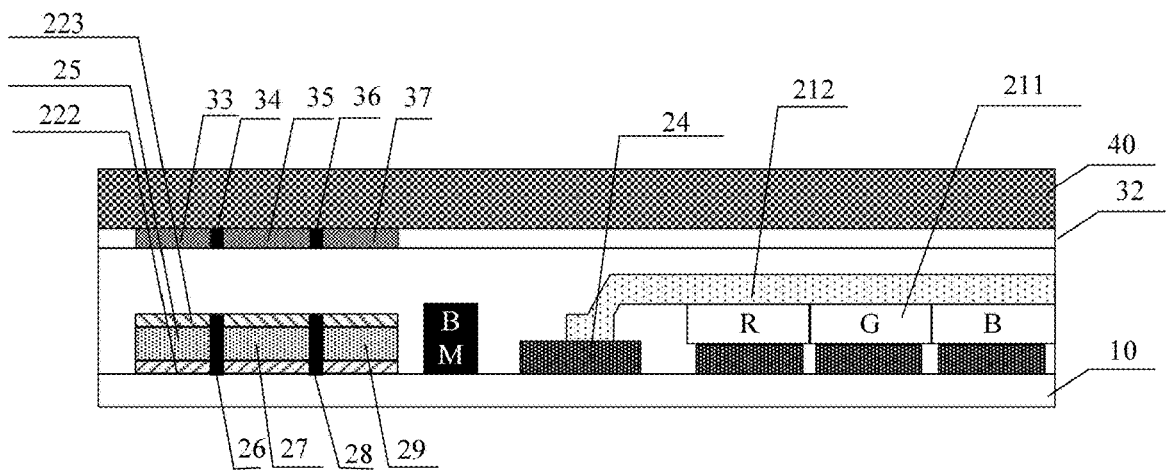
FIG. 10 is a fifth schematic diagram of a sectional structure of a display substrate according to an embodiment of the present disclosure.

In this embodiment, a light emitting element in the subpixel 211 may be an RGB OLED illustrated in FIG. 3 and FIG. 5, or may be white OLED (WOLED)+color filter illustrated in FIG. 6 and FIG. 9. The structure of the RGB OLED includes an anode layer, a hole injection layer, a hole transport layer, a light emitting layer, an electron transport layer, an electron injection layer, and a cathode layer, etc. The device structure of the WOLED may be a single light emitting layer (1 unit), or a stacked structure of two light emitting layers (2 units) or a plurality of light emitting layers (3 units). In the embodiment of the present disclosure, the use of the subpixel 211 as a display unit belongs to the conventional technical solution. Therefore, the layer structure in the OLED device is not limited in the embodiment of the present disclosure.

In this embodiment, the outer side of the visible light signal receiving region 22, i.e., the side away from the display region 21, may further include a variety of structural designs such as a blocking wall for packaging, which is not limited in the present disclosure.

In this embodiment, a design solution of the structure of the visible light signal receiving region 22 (for the fluorescent LED and RGB LED emitting ends), a position configuration solution of the visible light signal receiving region, and a display solution of the RGB OLED and WOLED+color filter may be combined with each other randomly, and are not limited to the structures illustrated in the drawings of the present disclosure.

In the embodiment of the present disclosure, the integration of visible light communication and display can be realized by designing the structure of the display substrate, and an extremely high transmission rate is implemented, thus making a great supplement to some display products that can only realize Internet connection via wireless communication technologies such as mobile communication (4G or 5G), Wireless Fidelity (WiFi), and Bluetooth.

Figure 12:
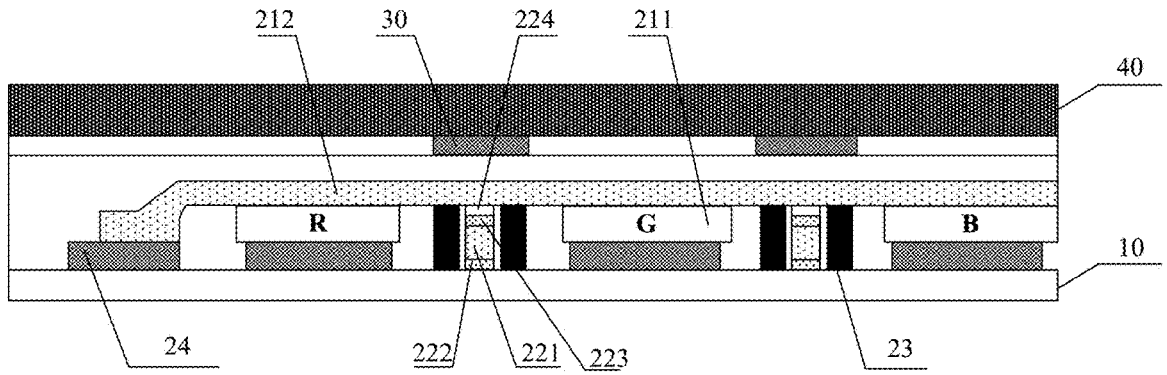
FIG. 12 is a sixth schematic diagram of a sectional structure of a display substrate according to an embodiment of the present disclosure.

FIG. 12 is a schematic diagram of a structure of a display substrate provided by another embodiment of the present disclosure. A photosensitive sensing unit 221 in this embodiment is disposed between subpixels of a display region. Referring to FIG. 12, the display substrate provided by this embodiment includes a substrate 10, wherein the substrate 10 includes a display region 21 and a peripheral region surrounding the display region 21, and the display region 21 includes a plurality of subpixels 211 and a visible light signal receiving region 22 located between the subpixels 211. The photosensitive sensing unit 221 is located in the visible light signal receiving region 22, and the photosensitive sensing unit 221 is configured to receive a visible light signal and convert the visible light signal into an electrical signal to achieve visible light communication.

In this embodiment, since the photosensitive sensing unit 221 may be made extremely small, the photosensitive sensing unit 221 may be disposed near each subpixel, or one photosensitive sensing unit 221 is disposed between a plurality of subpixels and presents a uniform distribution. The structure and arrangement of the subpixels in the display region 21 are not limited in the embodiment of the present disclosure.

In this embodiment, the shape of the visible light signal receiving region 22 located between the subpixels 211 may be a square, a circle, a rectangle, a rhombus, or an ellipse, or may be an extremely narrow strip receiving region spanning two or more subpixels.

In this embodiment, the photosensitive sensing unit 221 is isolated from the subpixels 211 by a light shielding wall 23, so as avoid stray light interference to the photosensitive sensing unit 221 generated when the subpixels 211 in the display region 21 emit light.

In an exemplary embodiment, the material of the light shielding wall 23 may be a photoresist resin material for making a black matrix. The height of the light shielding wall 23 may be equal to the height of a pixel definition layer, or slightly greater than the device height of the photosensitive sensing unit 221.

In this embodiment, at least one of the plurality of subpixels 211 includes an anode, a cathode 212, and a light emitting layer located between the anode and the cathode, the cathode 212 is located on the side of the substrate 10 away from the light emitting layer, the peripheral region includes a cathode overlap region 24, and the cathode 212 extends to the cathode overlap region 24.

In some embodiments of the present disclosure, the visible light signal receiving region 22 located between the subpixels 211 is provided with a first conductive layer 222, a second conductive layer 223, and an insulating isolation layer 224. The first conductive layer 222 is disposed on the surface of the photosensitive sensing unit 221 facing the substrate 10. The second conductive layer 223 is disposed on the surface of the photosensitive sensing unit 221 away from the substrate 10. The insulating isolation layer 224 is disposed on the surface of the second conductive layer 223 away from the photosensitive sensing unit 221. A second receiving region in this embodiment is located below the cathode 212. By designing the second conductive layer 223 and the first conductive layer 222 on the upper and lower sides of the photosensitive sensing unit 221 respectively and disposing the insulating isolation layer 224 between the second conductive layer 223 and the cathode 212, the conductivity of the photosensitive sensing unit 221 is improved and a voltage drop of the entire device is reduced.

In some other embodiments of the present disclosure, the visible light signal receiving region 22 located between the subpixels 211 is provided with the insulating isolation layer 224, and the insulating isolation layer 224 is disposed between the photosensitive sensing unit 221 and the cathode 212. When the visible light signal receiving region 22 is disposed between the subpixels of the display region 21, since the area is extremely small, it is not necessary to dispose conductive layers on the upper and lower sides of the photosensitive sensing unit 221, but only the insulating isolation layer 224 is disposed between the photosensitive sensing unit 221 and the cathode 212. The insulating isolation layer 224 may be made of an inorganic material such as silicon oxide, silicon nitride, or silicon oxynitride, or a transparent organic material.

In some embodiments of the present disclosure, the display substrate further includes a blue light filter layer 30 and a polarizer layer 40. The blue light filter layer 30 is disposed on the surface of the polarizer layer 40 facing or away from the photosensitive sensing unit 221, and the blue light filter layer 30 is opposite to the photosensitive sensing unit 221 in position. Considering that the polarizer layer 40 can filter out stray light in the sunlight, a better effect may be achieved by disposing the blue light filter layer 30 on the surface of the polarizer layer 40 facing the photosensitive sensing unit 221.

When the visible light emitting end is a fluorescent LED, since the fluorescent LED mainly operates by exciting phosphorus phosphor to generate yellow light using a blue LED, blue light and the yellow light mix to obtain white light. However, a slow response speed of the phosphorus phosphor limits the modulation bandwidth of the LED. Therefore, in the embodiment of the present disclosure, the blue light filter layer 30 is designed in a local region above the packaging layer to filter out the yellow light, so as to improve the modulation bandwidth, while the remaining region is a transparent layer that does not affect the display effect of the display region 21.

A blue light filter region in the blue light filter layer 30 is disposed above the photosensitive sensing unit 221, while the remaining region is a transparent layer. The material of the blue light filter region may be a conventional organic blue light filter material, a quantum dot material, or the like.

In this embodiment, for the structure of the display region, reference is made to the above embodiments, which is not described herein again.

This embodiment also realizes the technical effects of the above embodiments, including the integration of visible light communication and display and implementation of an extremely high transmission rate, thus making a great supplement to some display products that can only realize Internet connection via wireless communication technologies such as mobile communication, WiFi, and Bluetooth.

Figure 13:
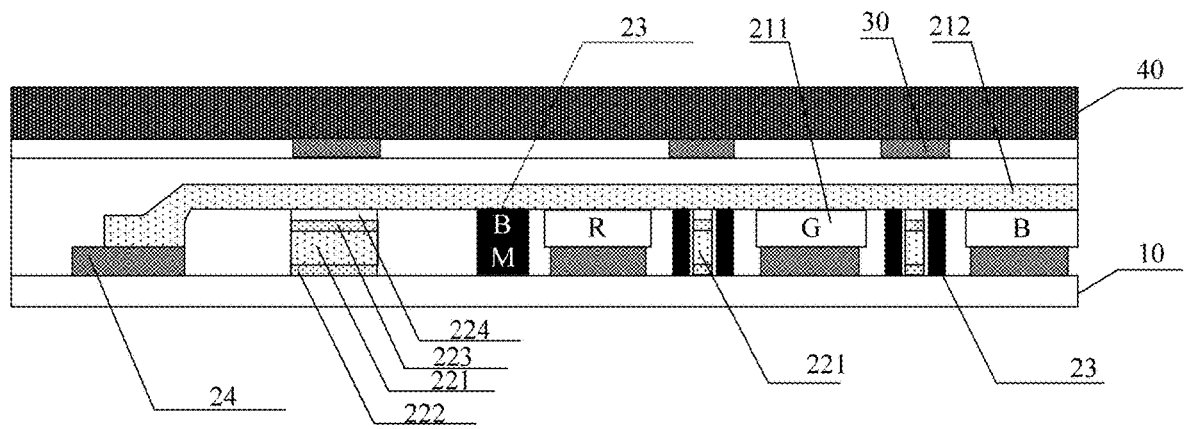
FIG. 13 is a seventh schematic diagram of a sectional structure of a display substrate according to an embodiment of the present disclosure.
Figure 14:
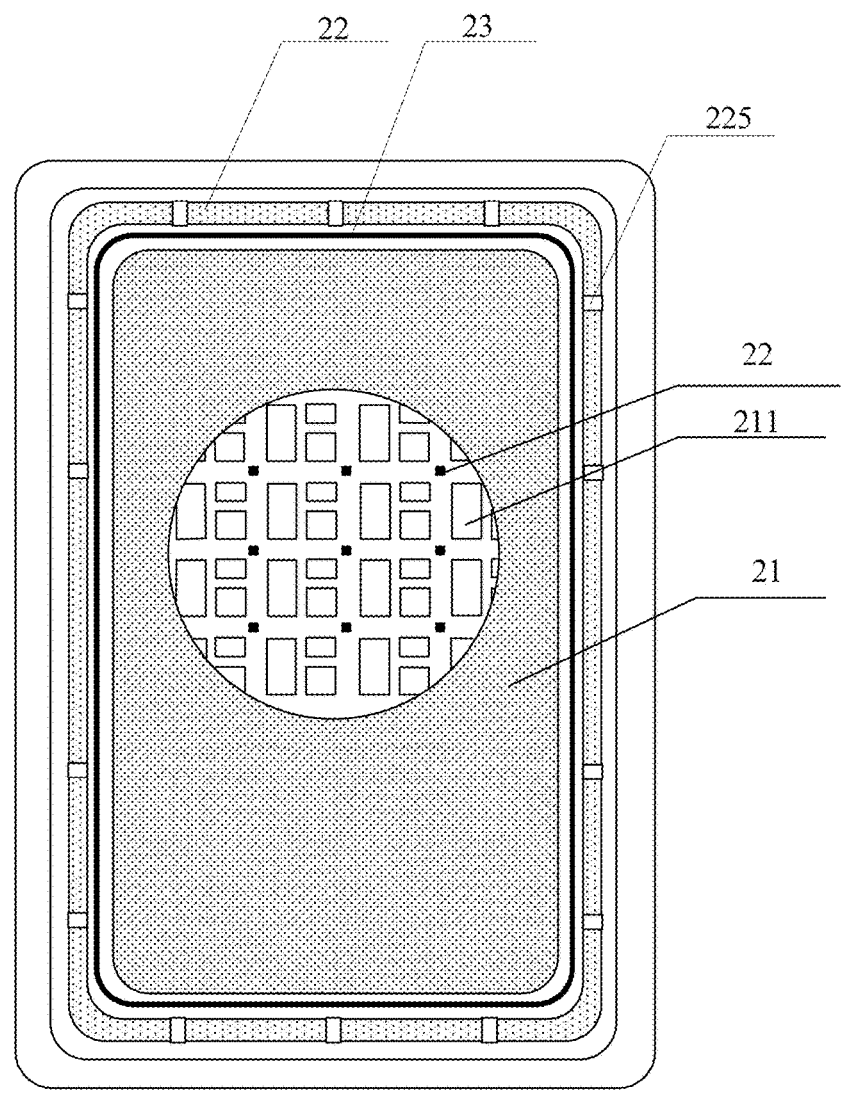
FIG. 14 is a third schematic diagram of a top-view structure of a display substrate according to an embodiment of the present disclosure.

FIG. 13 and FIG. 14 are schematic diagrams of a structure of a display substrate provided by another embodiment of the present disclosure. In this embodiment, a visible light signal receiving region 22 is disposed in both a display region and a peripheral region. Referring to FIGS. 13 and 14, the display substrate provided by this embodiment includes a substrate 10, wherein the substrate 10 includes a display region 21 and a peripheral region surrounding the display region 21, the peripheral region includes a visible light signal receiving region 22 surrounding the display region 21, and the display region 21 includes a plurality of subpixels 211 and a visible light signal receiving region 22 located between the subpixels 211. A photosensitive sensing unit 221 is located in the visible light signal receiving region 22, and the photosensitive sensing unit 221 is configured to receive a visible light signal and convert the visible light signal into an electrical signal to achieve visible light communication.

In this embodiment, a light shielding wall 23 is disposed between the visible light signal receiving region 22 in the peripheral region and the display region 21, and the visible light signal receiving region 22 between the subpixels 211 is isolated from the subpixels 211 by a light shielding wall 23, so as to avoid stray light interference to the visible light signal receiving region 22 generated when the subpixels 211 in the display region 21 emit light.

In order to reduce the interference to the visible light signal receiving region 22 generated when the subpixels of the display region 21 emit light, for the visible light signal receiving region 22, it is necessary to dispose an annular black light shielding wall between the visible light signal receiving region 22 in the peripheral region and the edge of the display region 21; for the visible light signal receiving region 22 located between the subpixels 211, it is necessary to dispose a black light shielding wall structure around the visible light signal receiving region 22 located between the subpixels 211, or to adopt a black PDL material rather than disposing a light shielding wall.

In this embodiment, for the structures of the visible light signal receiving region 22 located in the peripheral region, the visible light signal receiving region 22 located between the subpixels 211, and the display region 21, reference is made to the above embodiments, which is not described herein again.

This embodiment also realizes the technical effects of the above embodiments, including the integration of visible light communication and display and implementation of an extremely high transmission rate, thus making a great supplement to some display products that can only realize Internet connection via wireless communication technologies such as mobile communication, WiFi, and Bluetooth.

Figure 15:
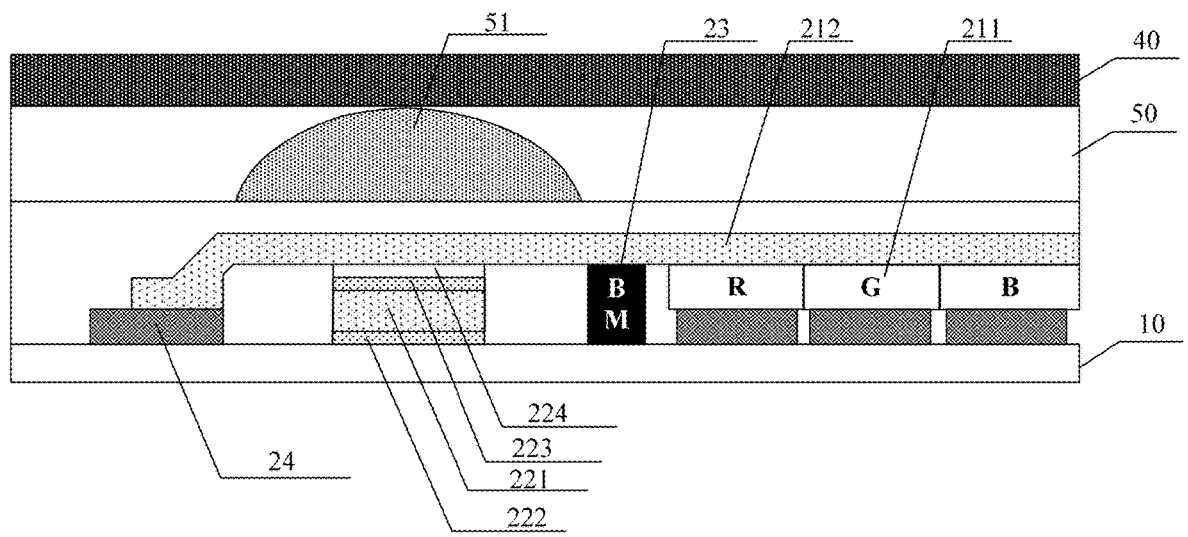
FIG. 15 is an eighth schematic diagram of a sectional structure of a display substrate according to an embodiment of the present disclosure.
Figure 16:
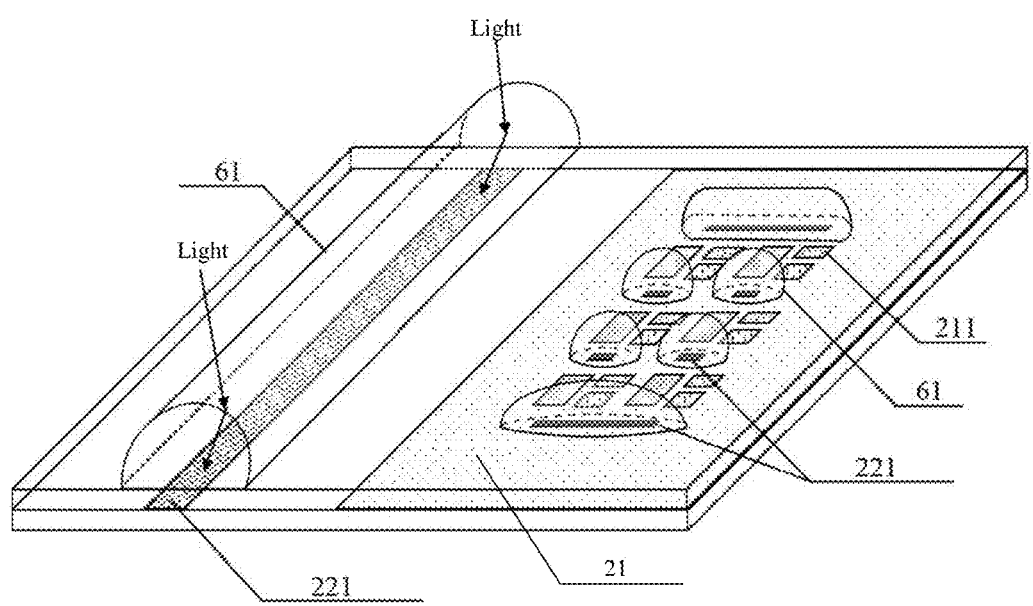
FIG. 16 is a fourth schematic diagram of a top-view structure of a display substrate according to an embodiment of the present disclosure.
Figure 17:
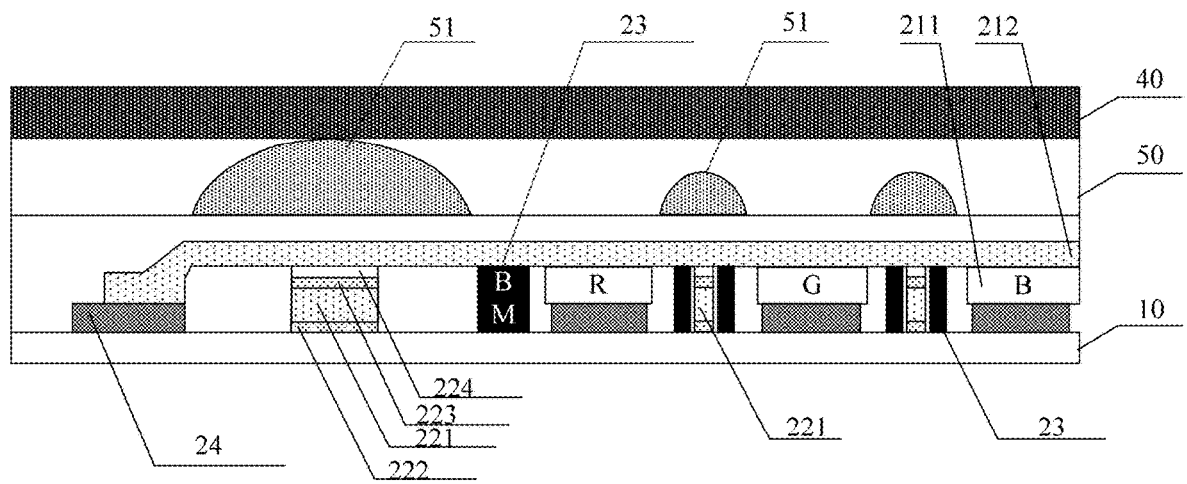
FIG. 17 is a ninth schematic diagram of a sectional structure of a display substrate according to an embodiment of the present disclosure.

FIG. 15, FIG. 16, and FIG. 17 are schematic diagrams of a structure of a display substrate provided by another embodiment of the present disclosure. The display substrate provided by this embodiment is provided with a lens layer (in this embodiment, the lens layer is a first lens layer 50). Referring to FIG. 15 to FIG. 17, the display substrate further includes a first lens layer 50, wherein the first lens layer 50 is provided with a first condenser lens 51 opposite to the visible light signal receiving region 22 in position, and a cross-sectional shape of the first condenser lens 51 is a bow shape or a semicircular shape.

In this embodiment, the first condenser lens 51 may be a semi-spherical lens or semi-ellipsoidal lens. The semi-spherical lens may be a semi-sphere with a height less than the spherical radius or a semi-sphere with a height equal to the spherical radius, both cases having different condensing performances, that is, the latter can condense light in a larger view field and has a smaller focused beam size.

In this embodiment, visible light communication beams may be condensed by the first lens layer 50, and the beam size is reduced, so that a smaller-sized visible light receiving region can receive light energy in a larger view field. In this way, the width of the annular visible light receiving region on the periphery of the display region can be significantly reduced to realize a narrow display screen frame, while a micro-sized visible light receiving region may be disposed between pixels in the display region to receive a light communication signal in the screen, without affecting the display resolution, thus solving the current problem that disposing a visible light receiving region in the display region reduces the display resolution.

In this embodiment, the semicircular shape has stronger condensing ability than the bow shape and can condense the beams near the circle center, thus requiring a smaller area of the light receiving region. The first condenser lens above the visible light signal receiving region 22 covers the position above the entire annular light receiving region, and finally forms an annular arch-shaped lens. In this embodiment, the width of the visible light signal receiving region 22 depends on the design the design requirement of the width of the screen frame and can match the condensing performance of the first condenser lens 51 above the visible light signal receiving region 22. The width of the visible light signal receiving region 22 is greater than or equal to the width of a facula of the lens. The shape of a second receiving region may be a square, a circle, a rectangle, a rhombus, or an ellipse, or may be an extremely narrow strip receiving region spanning two or more subpixels. Correspondingly, the shape of the lens above the second receiving region may be the same as the shape of the photosensitive sensing unit 221 below the second receiving region.

In this embodiment, the material of the first condenser lens 51 may be an organic material such as a resin material and polymethylmethacrylate, but is not limited to the above materials. The material is required to have high transmittance and high refractive index, which are conducive to the refraction and condensing of light.

In this embodiment, for the structures of the visible light signal receiving region 22 and the display region 21, reference is made to the above embodiments, which is not described herein again.

This embodiment also realizes the technical effects of the above embodiments, including the integration of visible light communication and display and implementation of an extremely high transmission rate, thus making a great supplement to some display products that can only realize Internet connection via wireless communication technologies such as mobile communication, WiFi, and Bluetooth. In this embodiment, by disposing the first condenser lens, the smaller-sized light receiving region can receive light energy in a larger view field to improve the visible light communication rate, while the frame width is not significantly increased and the display effect is not affected, thus achieving a better effect of the integration of communication and display.

Figure 18:
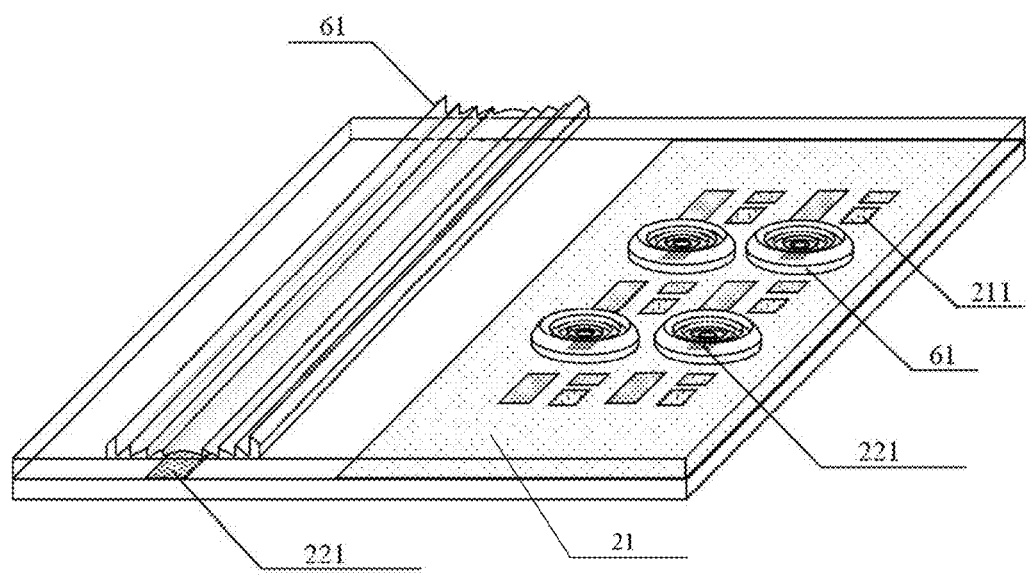
FIG. 18 is a fifth schematic diagram of a top-view structure of a display substrate according to an embodiment of the present disclosure.
Figure 19:
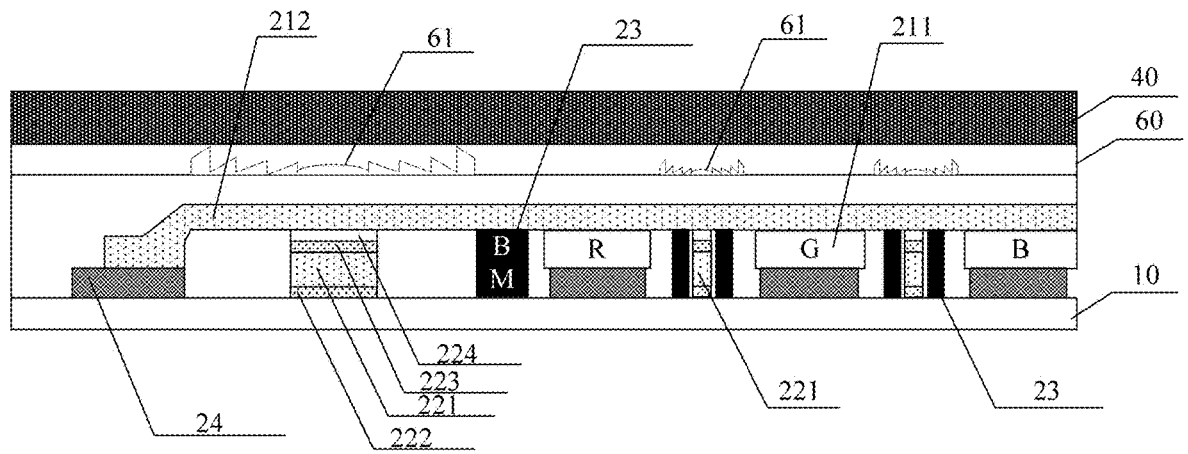
FIG. 19 is a tenth schematic diagram of a sectional structure of a display substrate according to an embodiment of the present disclosure.

FIG. 18 and FIG. 19 are schematic diagrams of a display substrate provided by another embodiment of the present disclosure. The display substrate provided this embodiment is provided with a lens layer (in this embodiment, the lens layer is a second lens layer 60). Referring to FIG. 18 and FIG. 19, the display substrate further includes a second lens layer 60, wherein the second lens layer 60 is provided with a second condenser lens 61 opposite to the visible light signal receiving region 22 in position, a cross-sectional shape of the second condenser lens 61 includes a first toothed portion, a curved surface portion, and a second toothed portion, the first toothed portion and the second toothed portion are symmetrical about the center of the curved surface portion, and the curved surface portion is a convex curved surface.

In this embodiment, visible light communication beams may be condensed by the second lens layer 60, and the beam size is reduced, so that a smaller-sized visible light receiving region can receive light energy in a larger view field. In this way, the width of the annular visible light receiving region on the periphery of the display region can be significantly reduced to realize a narrow display screen frame, while a micro-sized visible light receiving region may be disposed between pixels in the display region to receive a light communication signal in the screen, without affecting the display resolution, thus solving the current problem that disposing a visible light receiving region in the display region reduces the display resolution. In addition, in this embodiment, the thickness of a condenser micro-lens structure designed on the basis of the Fresnel lens principle is significantly reduced compared with the conventional convex lens, thus maintaining high condensing efficiency as well as improving light output efficiency of the display region, while improving the bending characteristic of a flexible display device. The above design can achieve a good display effect as well as the receiving of communication beams in a large area, thus finally achieving the integration of high-speed communication and display.

In this embodiment, the second condenser lens 61 is located right above the photosensitive sensing unit 221, the second condenser lens 61 is designed to be a plurality of toothed structures inclined at a certain angle, the toothed structures on the two sides are distributed symmetrically, and the center is a slightly convex curved surface.

In this embodiment, the material of the second condenser lens 61 may be an organic material such as a resin material and polymethylmethacrylate, but is not limited to the above materials. The material is required to have high transmittance and high refractive index, which are conducive to the refraction and condensing of light.

In this embodiment, the microstructure of the second condenser lens 61 may be manufactured by a molding method. For example, an ultra-fine microstructure may be manufactured by a method such as nano imprinting, but is not limited to this method, which is not limited in the embodiment of the present disclosure.

In this embodiment, the second lens layer 60, except for the position of the second condenser lens 61, is made of a transparent material, and the material may be the same as or different from the material of the second condenser lens 61, for example, a resin material of an optical transparent adhesive.

Figure 20:
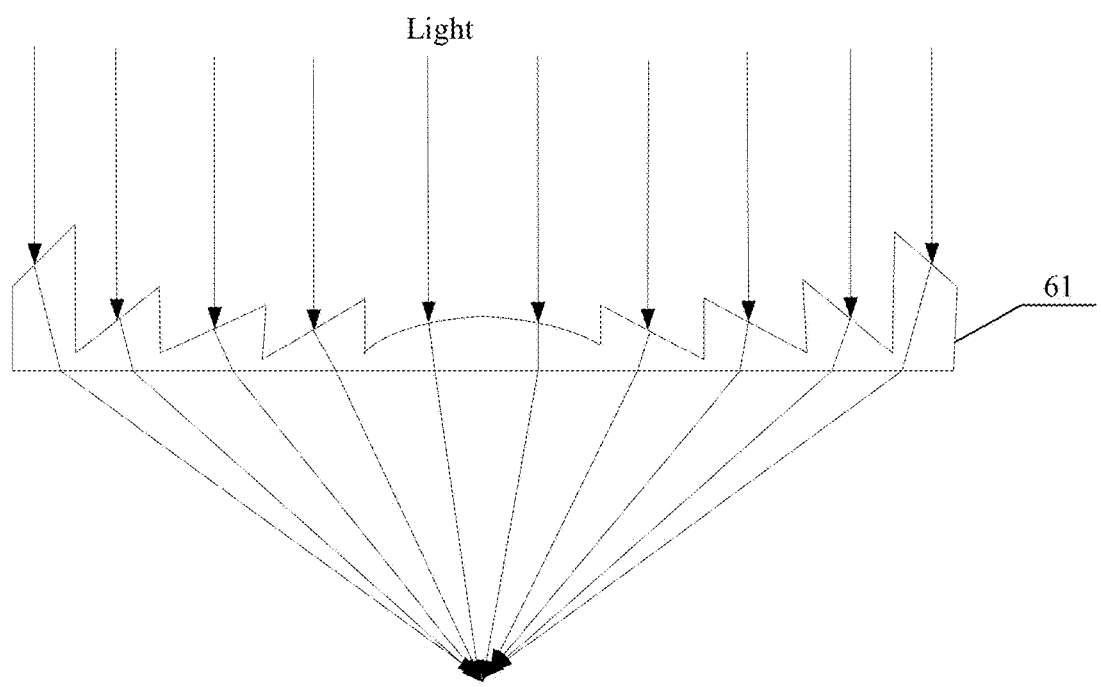
FIG. 20 is a schematic diagram of a condensing effect of a second condenser lens according to an embodiment of the present disclosure.

In this embodiment, the condensing effect of the second condenser lens 61 is as illustrated in FIG. 20.

Figure 21:
FIG. 21 is a first schematic diagram of a cross-sectional shape of a second condenser lens according to an embodiment of the present disclosure.

In this embodiment, the structure of the first toothed portion and second toothed portion may be either of the following cases:

Referring to FIG. 21, the first toothed portion and the second toothed portion each include a plurality of concentric annular teeth, and each concentric annular tooth is inclined at a preset angle towards the direction to the circle center.

Figure 22:
FIG. 22 is a second schematic diagram of a cross-sectional shape of a second condenser lens according to an embodiment of the present disclosure.
Figure 23:
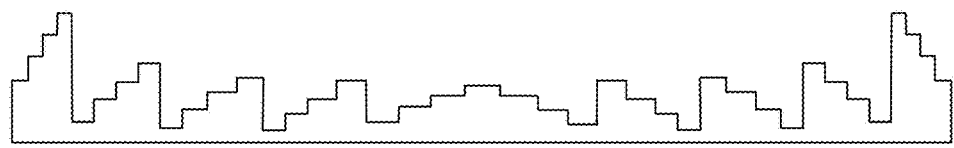
FIG. 23 is a third schematic diagram of a cross-sectional shape of a second condenser lens according to an embodiment of the present disclosure.

Alternatively, referring to FIG. 22 and FIG. 23, the first toothed portion and the second toothed portion each include a plurality of stepped teeth, and each stepped tooth is inclined at a preset angle towards the direction to the curved surface center.

In this embodiment, referring to FIG. 21, FIG. 22, and FIG. 23, the structure of the curved surface may be a convex annular curved surface or a convex stepped curved surface.

Referring to FIG. 18, the structure of the second condenser lens corresponding to the upper side of the visible light signal receiving region 22 is mainly an annular strip structure (see the left part in FIG. 18), while the structure of the second condenser lens corresponding to the upper side of the second receiving region may be a concentric circular structure (see the right part in FIG. 18), the structure of the circular lens may be a plurality of concentric circular teeth, and the teeth are inclined towards the direction to the circle center on the whole, thus playing the role of condensing. A sectional view of the circular lens structure is the same as that of the linear lens, as illustrated in FIG. 19.

Figure 24:
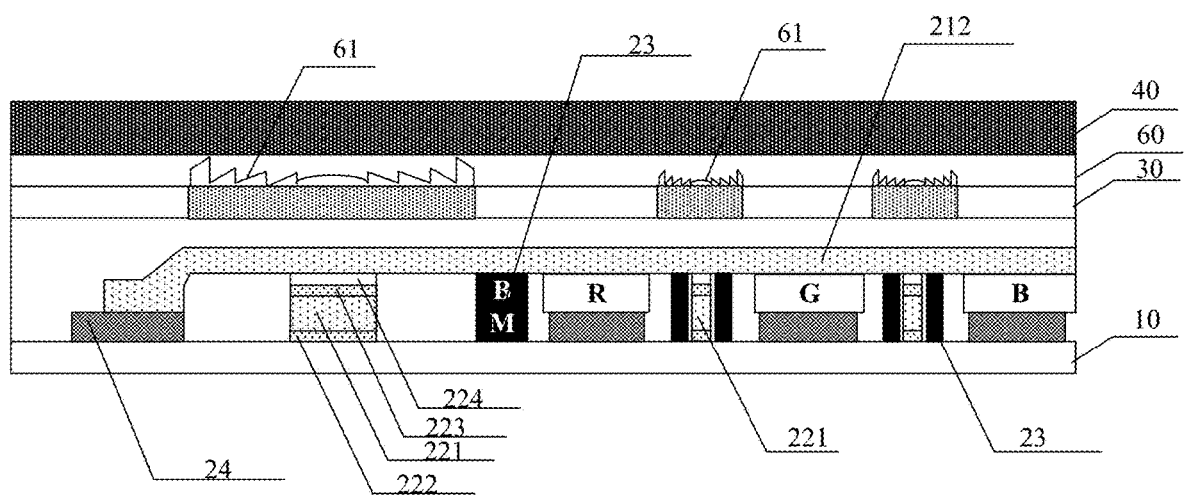
FIG. 24 is an eleventh schematic diagram of a sectional structure of a display substrate according to an embodiment of the present disclosure.

In this embodiment, referring to FIG. 24, the display substrate further includes a blue light filter layer 30 and a polarizer layer 40. The blue light filter layer 30 is disposed in the same layer as the second lens layer 60 (that is, the second lens layer 60 contains a blue light filter material, and the second lens layer 60 can play both roles of lens condensing and blue light filtering), or is disposed on the surface of the second lens layer 60 facing the substrate 10; the second lens layer 60 and the blue light filter layer 30 are disposed on the surface of the polarizer layer 40 facing or away from the photosensitive sensing unit 221 and are opposite to the visible light signal receiving region 22 in position. By disposing the blue light filter layer 30 and the second lens layer 60 on the same layer, the total thickness of the display device structure can be reduced and the bending characteristic can be improved.

The blue light filter layer 30 is configured to filter out yellow light in a fluorescent LED emitting end to improve the modulation bandwidth. Since regions on the layer where the blue light filter layer 30 is located other than the filter region are transparent layers, the display effect of the display region is not affected, as illustrated in FIG. 24. The blue light filter layer may be disposed above the second lens layer 60 or below the second lens layer 60. When the blue light filter layer is disposed above the second lens layer 60, the area of the filter region is required to be greater than or equal to the lens area; when the blue light filter layer is disposed below the filter region, the area of filter region may be less than the lens area but is required to be greater than or equal to the area of the visible light receiving region. In this embodiment, the distance between the second lens layer 60 and the photosensitive sensing unit 221 may be adjusted by adjusting the thickness of the blue light filter layer 30.

In this embodiment, for the structures of the visible light signal receiving region 22 and the display region 21, reference is made to the above embodiments, which is not described herein again.

This embodiment also realizes the technical effects of the above embodiments, including the integration of visible light communication and display and implementation of an extremely high transmission rate, thus making a great supplement to some display products that can only realize Internet connection via wireless communication technologies such as mobile communication, WiFi, and Bluetooth. In addition, in this embodiment, by disposing the first condenser lens, the smaller-sized light receiving region can receive light energy in a larger view field to improve the visible light communication rate, while the frame width is not significantly increased and the display effect is not affected, thus achieving a better effect of the integration of communication and display.

An embodiment of the present disclosure further provides a visible light communication apparatus, including the display substrate described in any one of the above embodiments. For the structure of the display substrate, reference is made to any one of the above embodiments, which is not described herein again. The visible light communication apparatus provided by the embodiment of the present disclosure may be any product or component with visible light communication and display functions, such as a mobile phone, a tablet computer, a TV, a display, a notebook computer, a digital photo frame, or a navigator.

Figure 25:
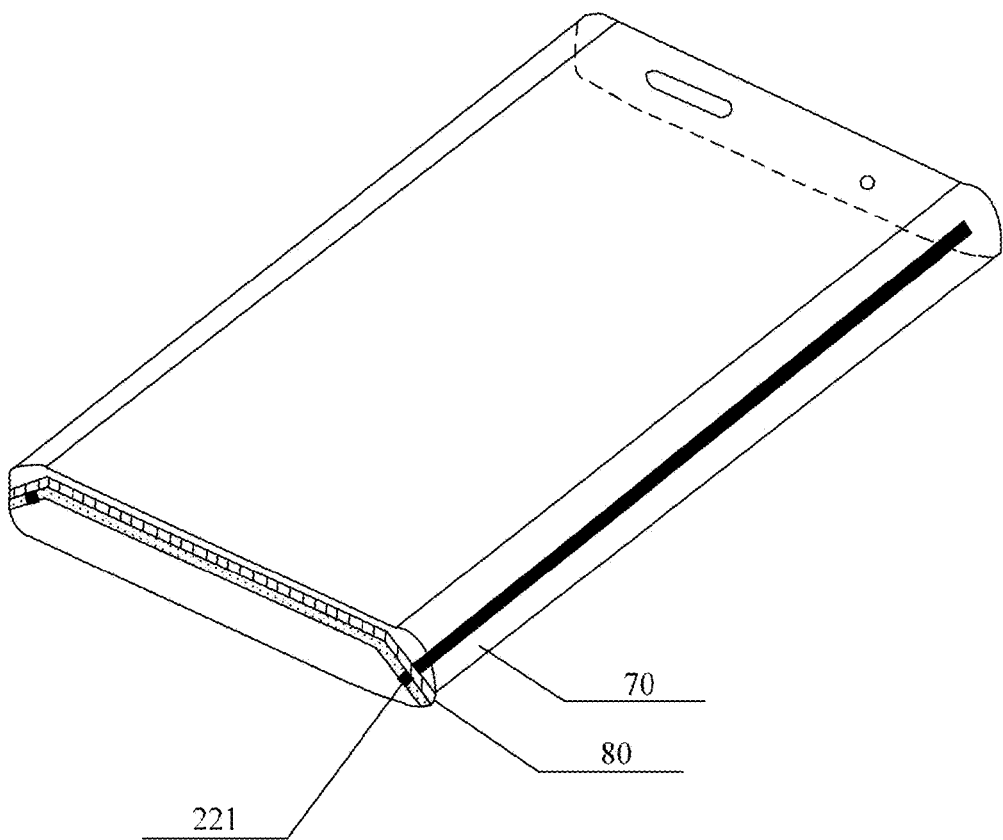
FIG. 25 is a first schematic diagram of a structure of a visible light communication apparatus according to an embodiment of the present disclosure.
Figure 26:
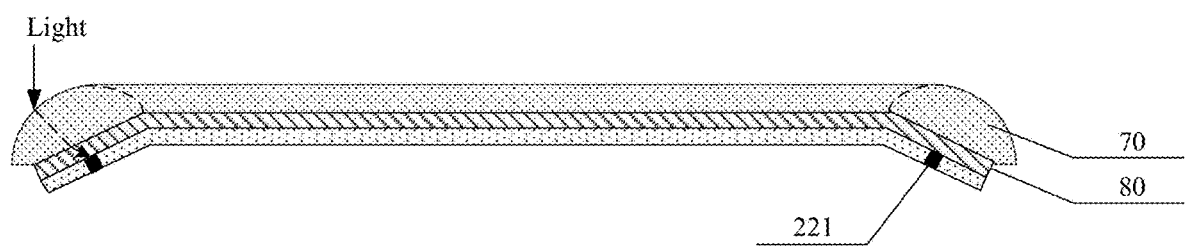
FIG. 26 is a second schematic diagram of a structure of a visible light communication apparatus according to an embodiment of the present disclosure.

In this embodiment, referring to FIG. 25 and FIG. 26, the visible light communication apparatus may further include cover glass 70. The outer surface of the edge of the cover glass 70 is an arc surface, and the inner surface of the edge of the cover glass 70 is a planar surface, so that the edge of the cover glass 70 forms a spherical lens.

In this embodiment, the arc surface may be a parabolic arc surface or a circular arc surface.

In this embodiment, in a sectional view of the edge of the cover glass 70, after the radian of the outer surface is complemented, it can be seen that the shape of the cover glass may be a bow shape or a semicircular shape. The two shapes of cover glass have different light condensing abilities (narrowing effects) and focal lengths. When having a larger radian, the semicircular shape may have a better narrowing effect at a smaller focal length.

In this embodiment, the visible light communication apparatus may further include a functional layer 80. The functional layer 80 may be a touch panel layer, a polarizer layer, an optical transparent adhesive layer, or a protective layer.

In this embodiment, when the display substrate is provided with the first lens layer or the second lens layer, the distance between the first condenser lens or the second condenser lens and the center of the spherical lens formed by the cover glass 70 is less than or equal to a preset distance threshold.

Figure 27:
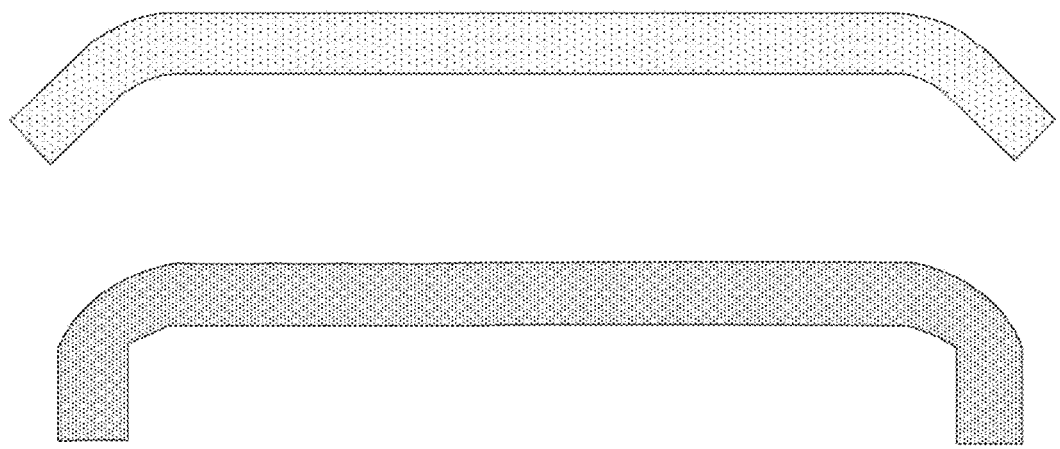
FIG. 27 is a schematic diagram of some designs for an edge structure of cover glass.
Figure 28:
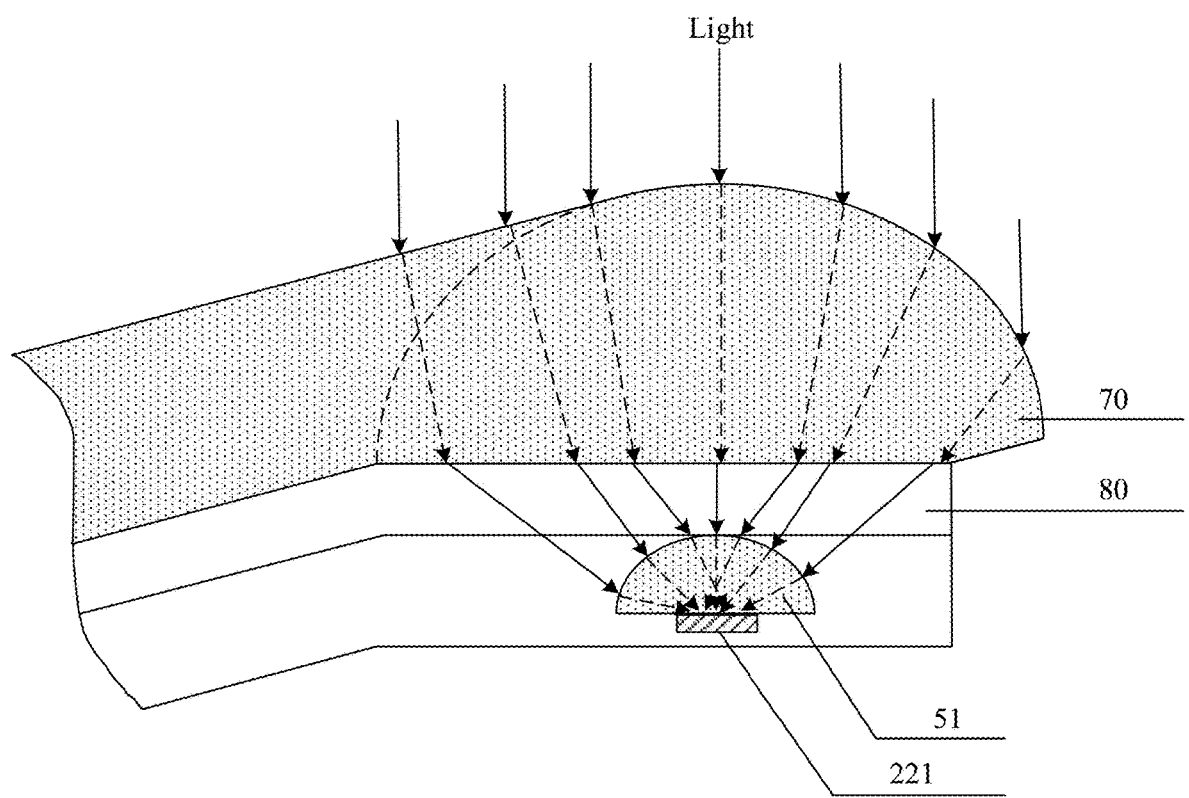
FIG. 28 is a third schematic diagram of a structure of a visible light communication apparatus according to an embodiment of the present disclosure.

In this embodiment, the lens-like arc design of the outer surface of the edge of the cover glass is different from design solutions of some 2.5D screens (waterdrop screens) and 3.5D screens (waterfall screens). The edge designs of cover glass of some screens are as illustrated in FIG. 27, with main functions of reducing the frame effect, improving the visual expression, and replacing a side physical key. Therefore, the edge is not provided with a design similar to a lens structure and does not have the function of converging. In the embodiment of the present disclosure, light beams are narrowed to the lower first lens layer or the second lens layer after preliminary convergence of the upper glass lens. Referring to FIG. 28, the distance between the upper and lower lenses is adjusted by adjusting the thickness of the functional layer 80. The bending radian of the upper surface of the edge of the cover glass and the size and radian of the lower lens are not limited in the embodiment of the present disclosure, and are comprehensively determined according to the requirements on the product design in actual implementation. For example, after a parameter specification is determined, other specification parameters may be determined step by step, and the specification parameters may be determined by designing the thickness of the functional layer to adjust the distance between the two lenses.

In this embodiment, the visible light communication apparatus may further include various components such as a mainboard, a speaker, a camera, and a housing, which are not limited herein.

This embodiment also realizes the technical effects of the above embodiments, including the integration of visible light communication and display and implementation of an extremely high transmission rate, thus making a great supplement to some display products that can only realize Internet connection via wireless communication technologies such as mobile communication, WiFi, and Bluetooth. In this embodiment, by configuring the section shape of the edge of the cover glass, the smaller-sized light receiving region can receive light energy in a larger view field to improve the visible light communication rate, while the frame width is not significantly increased and the display effect is not affected, thus achieving a better effect of the integration of communication and display.

An embodiment of the present disclosure further provides a method for manufacturing a display substrate. FIG. 29 is a flowchart of a method for manufacturing a display substrate provided by the embodiment of the present disclosure. Referring to FIG. 29, the method for manufacturing the display substrate provided by the embodiment of the present disclosure includes the following acts:

In act 100, a drive circuit layer and a photosensitive sensing unit located in a visible light signal receiving region are formed on a substrate, wherein the drive circuit layer includes a first drive circuit and a second drive circuit, the first drive circuit is configured to drive the photosensitive sensing unit, the second drive circuit is configured to drive a subpixel of a display region, and the photosensitive sensing unit is configured to receive a visible light signal and convert the visible light signal into an electrical signal to achieve visible light communication.

In act 200, the subpixel of the display region is formed on the drive circuit layer, wherein the visible light signal receiving region is disposed in a peripheral annular region surrounding the display region.

In this embodiment, in act 100, a light shielding wall, a cathode overlap region, and an anode layer of the display region are further formed on the substrate.

In this embodiment, in act 200, a light emitting layer is formed on the drive circuit layer; and a cathode is formed on the light emitting layer.

In this embodiment, the method further includes forming a packaging layer on the cathode after act 200.

When the visible light signal receiving region is disposed between the cathode overlap region and the edge of the display substrate, a first conductive layer, the photosensitive sensing unit, and a second conductive layer may be formed in the visible light signal receiving region, the light shielding wall is formed between the visible light signal receiving region and the edge of the cathode overlap region, the anode layer and the cathode overlap region are formed in the display region, then the light emitting layer is formed in a pixel structure of the display region, the cathode is formed on the light emitting layer, and finally the packaging layer is formed.

In this embodiment, when the visible light signal receiving region is disposed between the cathode overlap region and the edge of the display region, a first conductive layer, the photosensitive sensing unit, a second conductive layer and an insulating isolation layer may be formed in the visible light signal receiving region, the light shielding wall may be formed between the visible light signal receiving region and the edge of the display region, the anode layer and the cathode overlap region are formed in the display region, then the light emitting layer is formed in a pixel structure of the display region, the cathode is formed on the insulating isolation layer of the visible light signal receiving region and the light emitting layer of the display region, and finally the packaging layer is formed.

In this embodiment, a drive switch may be formed before the first conductive layer of the visible light signal receiving region is formed. The drive switch includes an active layer, a gate, an insulating layer, a source-drain, and a conductive layer. The drain or source of the drive switch is connected to the photosensitive sensing unit or the first conductive layer by the conductive layer.

In this embodiment, the photosensitive sensing unit may be manufactured by a vacuum thermal evaporation method, a spin coating method, an inkjet printing method, etc.

In this embodiment, the second conductive layer and the first conductive layer may be made of metal elements such as magnesium (Mg), silver (Ag), and aluminum (Al) or metal alloys such as magnesium/silver (Mg/Ag), and main functions thereof are improving the conductivity of an upper electrode of the photodiode and reducing the voltage drop caused by the excessively large length of the entire device. Therefore, the metal component is not limited to the metals listed above. In addition, the metal layer is required to have good transmittance, and the thickness thereof ranges between 0.1 nm and 500 nm depending on the selected material. The second conductive layer and the first conductive layer may also be made of metal oxides, such as indium tin oxide (ITO) and indium zinc oxide (IZO), and are required to have good conductivity and high transmittance to ensure efficient passage of the emitted light signal.

In this embodiment, the insulating isolation layer may be made of an inorganic material, such as silicon nitride, silicon oxide, or silicon oxynitride, or may be made of an organic material, such as a resin material or polyimide, but is not limited to the above materials. The material of this layer is required to be colorless and have good transmittance.

In some embodiments, the visible light signal receiving region may also be located between the subpixels and isolated from the subpixels by a light shielding wall.

In this embodiment, for the visible light signal receiving region disposed between the subpixels, the first conductive layer, the photosensitive sensing unit, the second conductive layer, and the insulating isolation layer may be formed in the display region, the light shielding wall is formed around the visible light signal receiving region, then the OLED organic light emitting layer is formed in the pixel structure of the display region, the cathode is formed on the insulating isolation layer and the organic light emitting layer of the display region, and finally the packaging layer is formed.

In this embodiment, the method may further include the following acts:

A blue light filter layer or a complex filter layer opposite to the visible light signal receiving region in position is formed.

A polarizer layer is formed on the blue light filter layer or the complex filter layer.

In this embodiment, the method may further include the following acts:

A first lens layer or a second lens layer opposite to the visible light signal receiving region in position is formed.

A polarizer layer is formed on the first lens layer or the second lens layer.

In this embodiment, when the filter layer and the lens layer are manufactured at the same time, the blue light filter layer or the complex filter layer may be disposed on the same layer as the first lens layer or the second lens layer (that is, the second lens layer contains a blue light filter material, and the second lens layer can play both roles of lens condensing and blue light filtering), or the blue light filter layer or the complex filter layer may be formed first and then the first lens layer or the second lens layer is formed on the blue light filter layer or the complex filter layer.

In this embodiment, the material of the first lens layer or the second lens layer may be an organic material such as a resin material and polymethylmethacrylate, but is not limited to the above materials. The material is required to have high transmittance and high refractive index, which are conducive to the refraction and condensing of light.

In this embodiment, the microstructure of the first lens layer or the second lens layer may be manufactured by a molding method. For example, an ultra-fine microstructure may be manufactured by a method such as nano imprinting, but is not limited to this method, which is not limited in the embodiment of the present disclosure.

The following points need to be stated:

The drawings of the embodiments of the present disclosure only involve the structures involved in the embodiments of the present disclosure, and for other structures, reference is made to the general design.

Without conflict, the features in the embodiments of the present disclosure may be combined with each other to obtain new embodiments.

Although the embodiments disclosed in the present disclosure are as described above, the contents described are only embodiments adopted for the convenience of understanding the present disclosure and are not used to limit the present disclosure. Any person skilled in the art may make any modification and change in the form and details of implementation without departing from the spirit and scope disclosed in the present disclosure. However, the scope of protection of the present disclosure shall still be subject to the scope defined in the appended claims.

What is claimed is:

1. A display substrate, comprising:
   a substrate comprising a display region and a peripheral region surrounding the display region, wherein the peripheral region comprises a visible light signal receiving region surrounding the display region;
   a photosensitive sensing unit located in the visible light signal receiving region, wherein the photosensitive sensing unit is configured to receive a visible light signal and convert the visible light signal into an electrical signal to achieve visible light communication; and
   a plurality of subpixels located in the display region, wherein:
   at least one of the plurality of subpixels comprises an anode, a cathode, and a light emitting layer located between the anode and the cathode, and the cathode is located on a side of the substrate away from the light emitting layer; and the peripheral region comprises a cathode overlap region, the cathode extends to the cathode overlap region, and the photosensitive sensing unit is located between the cathode overlap region and the display region and between the cathode and the substrate.

2. The display substrate according to claim 1, wherein the visible light signal receiving region is further provided with a first conductive layer, a second conductive layer, and an insulating isolation layer, the first conductive layer is disposed on a surface of the photosensitive sensing unit facing the substrate, the second conductive layer is disposed on a surface of the photosensitive sensing unit away from the substrate, and the insulating isolation layer is disposed on a surface of the second conductive layer away from the photosensitive sensing unit.

3. The display substrate according to claim 1, further comprising a plurality of subpixels located in the display region, wherein the photosensitive sensing unit is also located between the subpixels and is isolated from the subpixels by a light shielding wall.

4. The display substrate according to claim 1, wherein the visible light signal receiving region is further provided with a plurality of drive switches, and a drive switch is configured to control switch-on and switch-off of the photosensitive sensing unit under control of a drive circuit.

5. The display substrate according to claim 1, wherein a light shielding wall is disposed between the visible light signal receiving region and the display region.

6. The display substrate according to claim 1, wherein a blue light filter layer and a polarizer layer are further disposed on the substrate, and the blue light filter layer is disposed on a surface of the polarizer layer facing or away from the photosensitive sensing unit and is opposite to the visible light signal receiving region in position.

7. The display substrate according to claim 1, wherein the visible light signal receiving region comprises a first color receiving region, a second color receiving region, and a third color receiving region, a first isolation region is disposed between the first color receiving region and the second color receiving region, and a second isolation region is disposed between the second color receiving region and the third color receiving region.

8. The display substrate according to claim 7, wherein a complex filter layer and a polarizer layer are further disposed on the substrate, the complex filter layer is disposed on a surface of the polarizer layer facing or away from the photosensitive sensing unit, the complex filter layer comprises a first color filter layer, a second color filter layer, and a third color filter layer, a third isolation region is disposed between the first color filter layer and the second color filter layer, a fourth isolation region is disposed between the second color filter layer and the third color filter layer, the first color filter layer is opposite to the first color receiving region in position, the second color filter layer is opposite to the second color receiving region in position, and the third color filter layer is opposite to the third color receiving region in position.

9. The display substrate according to claim 1, wherein a lens layer is further disposed on the substrate, the lens layer is provided with a condenser lens opposite to the visible light signal receiving region in position, and a cross-sectional shape of the condenser lens comprises any one or more of the following cases:

the cross-sectional shape of the condenser lens is a bow shape;

the cross-sectional shape of the condenser lens is a semicircular shape; and the cross-sectional shape of the condenser lens comprises a first toothed portion, a curved surface portion, and a second toothed portion, the first toothed portion and the second toothed portion are symmetrical about a center of the curved surface portion, and the curved surface portion is a convex curved surface.

10. The display substrate according to claim 9, wherein the structure of the first toothed portion and the second toothed portion is either of the following cases:

the first toothed portion and the second toothed portion each comprise a plurality of concentric annular teeth, and each concentric annular tooth is inclined at a preset angle towards a direction to a circle center; or the first toothed portion and the second toothed portion each comprise a plurality of stepped teeth, and each stepped tooth is inclined at a preset angle towards a direction to a curved surface center;

wherein the structure of the curved surface portion is a convex annular curved surface or a convex stepped curved surface.

11. The display substrate according to claim 9, wherein a filter layer and a polarizer layer are further disposed on the substrate, and the filter layer is disposed in a same layer as the lens layer or disposed on a surface of the lens layer facing the substrate; and the lens layer and the filter layer are disposed on a surface of the polarizer layer facing or away from the photosensitive sensing unit, and are opposite to the visible light signal receiving region in position.

12. A visible light communication apparatus, comprising the display substrate according to claim 1.

13. The visible light communication apparatus according to claim 12, further comprising cover glass, wherein an outer surface of an edge of the cover glass is an arc surface, and an inner surface of the edge of the cover glass is a planar surface, so that the edge of the cover glass forms a spherical lens.

14. A method for manufacturing a display substrate, comprising:

forming a drive circuit layer and a photosensitive sensing unit located in a visible light signal receiving region on a substrate, wherein the drive circuit layer comprises a first drive circuit and a second drive circuit, the first drive circuit is configured to drive the photosensitive sensing unit, the second drive circuit is configured to drive a plurality of subpixels of a display region, and the photosensitive sensing unit is configured to receive a visible light signal and convert the visible light signal into an electrical signal to achieve visible light communication; and forming the plurality of subpixels of the display region on the drive circuit layer, wherein the visible light signal receiving region is disposed in a peripheral annular region surrounding the display region, wherein:

at least one of the plurality of subpixels comprises an anode, a cathode, and a light emitting layer located between the anode and the cathode, and the cathode is located on a side of the substrate away from the light emitting layer; and the peripheral annular region comprises a cathode overlap region, the cathode extends to the cathode overlap region, and the photosensitive sensing unit is located between the cathode overlap region and the display region and between the cathode and the substrate.

15. The manufacturing method according to claim 14, wherein the visible light signal receiving region is also disposed between subpixels and is isolated from the subpixels by a light shielding wall.

16. The manufacturing method according to claim 14, further comprising:
   forming a blue light filter layer or a complex filter layer opposite to the visible light signal receiving region in position; and
   forming a polarizer layer on the blue light filter layer or the complex filter layer.

* * * * *